(12) United States Patent
Li et al.

(10) Patent No.: US 11,901,492 B2
(45) Date of Patent: Feb. 13, 2024

(54) HIGH COLOR RENDERING WHITE LIGHT EMITTING DEVICES AND HIGH COLOR RENDERING PHOTOLUMINESCENCE COMPOSITIONS

(71) Applicant: Intematix Corporation, Fremont, CA (US)

(72) Inventors: Yi-Qun Li, Danville, CA (US); Gang Wang, Sunnyvale, CA (US); Haitao Yang, San Jose, CA (US); Binghua Chai, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 17/103,798

(22) Filed: Nov. 24, 2020

(65) Prior Publication Data
US 2022/0165920 A1 May 26, 2022
US 2023/0093788 A9 Mar. 23, 2023

Related U.S. Application Data

(63) Continuation-in-part of application No. 16/403,723, filed on May 6, 2019, now Pat. No. 10,847,566, and
(Continued)

(51) Int. Cl.
*H01L 33/50* (2010.01)
(52) U.S. Cl.
CPC .................. *H01L 33/504* (2013.01)
(58) Field of Classification Search
CPC ... H01L 33/504; H01L 33/32; C09K 11/0883; C09K 11/7792; C09K 11/617
See application file for complete search history.

(56) References Cited

U.S. PATENT DOCUMENTS

| 7,497,973 B2 | 3/2009 | Radkov et al. |
| 8,890,403 B2 | 11/2014 | Sakuta et al. |

(Continued)

FOREIGN PATENT DOCUMENTS

| CN | 102986044 B | 5/2015 |
| CN | 108352432 A | 7/2018 |

(Continued)

OTHER PUBLICATIONS

Considerations for Blending LED Phosphors, Applications Note, Intematix Corporation, Jan. 2013.
(Continued)

*Primary Examiner* — Sarah K Salerno
(74) *Attorney, Agent, or Firm* — CrossPond Law

(57) ABSTRACT

A light emitting device comprises: a solid-state light emitter which generates blue excitation light with a dominant wavelength from 440 nm to 470 nm; a yellow to green photoluminescence material which generates light with a peak emission wavelength from 500 nm to 575 nm; a broadband orange to red photoluminescence material which generates light with a narrowband peak emission wavelength from 580 nm to 620 nm; and a narrowband red manganese-activated fluoride phosphor which generates light with a peak emission wavelength from 625 nm to 635 nm. The device generates white light with a spectrum having a broad emission peak from about 530 nm to about 600 nm and a narrow emission peak and wherein the ratio of the peak emission intensity of the broad emission peak to the peak emission intensity of the narrow emission peak is at least 20%.

23 Claims, 14 Drawing Sheets

Related U.S. Application Data a continuation-in-part of application No. 15/256,252, filed on Sep. 2, 2016, now abandoned.

(60) Provisional application No. 62/667,351, filed on May 4, 2018, provisional application No. 62/344,930, filed on Jun. 2, 2016, provisional application No. 62/216,985, filed on Sep. 10, 2015.

(56) References Cited

U.S. PATENT DOCUMENTS

| | | | |
|---|---|---|---|
| 9,871,173 B2 | 1/2018 | Todorov et al. | |
| 2006/0152140 A1 | 7/2006 | Brandes | |
| 2008/0152933 A1 | 6/2008 | Mizuno et al. | |
| 2008/0157653 A1 | 7/2008 | Schmidt et al. | |
| 2009/0020775 A1* | 1/2009 | Radkov | H01L 33/502 257/E33.061 |
| 2009/0086475 A1 | 4/2009 | Caruso et al. | |
| 2010/0001648 A1 | 1/2010 | De Clercq et al. | |
| 2011/0068354 A1 | 3/2011 | Tran et al. | |
| 2012/0057100 A1 | 3/2012 | Masuda et al. | |
| 2012/0127734 A1 | 5/2012 | Tanimoto et al. | |
| 2012/0132929 A1 | 5/2012 | Selverian et al. | |
| 2012/0155061 A1 | 6/2012 | Manabe et al. | |
| 2012/0236553 A1 | 9/2012 | Cash | |
| 2013/0188333 A1 | 7/2013 | Ooya et al. | |
| 2013/0264937 A1 | 10/2013 | Sakuta et al. | |
| 2014/0009061 A1 | 1/2014 | Itoga et al. | |
| 2014/0168943 A1 | 6/2014 | Peeters et al. | |
| 2014/0264418 A1 | 9/2014 | Murphy et al. | |
| 2014/0340890 A1 | 11/2014 | Hata et al. | |
| 2015/0035430 A1 | 2/2015 | Yoshida et al. | |
| 2015/0048399 A1* | 2/2015 | Weiler | C09K 11/025 427/157 |
| 2015/0061489 A1 | 3/2015 | Gu et al. | |
| 2015/0084075 A1 | 3/2015 | Watanabe | |
| 2015/0329770 A1 | 11/2015 | Kaneyoshi et al. | |
| 2016/0116124 A1* | 4/2016 | Podowitz | C09K 11/675 362/84 |
| 2016/0133799 A1 | 5/2016 | Park et al. | |
| 2016/0146433 A1 | 5/2016 | Bukesov et al. | |
| 2016/0276549 A1 | 9/2016 | Yamashita et al. | |
| 2016/0316527 A1 | 10/2016 | Allen et al. | |
| 2016/0372638 A1* | 12/2016 | Todorov | H01L 33/504 |
| 2017/0009131 A1* | 1/2017 | Wataya | F21V 1/17 |
| 2017/0054059 A1 | 2/2017 | Hosokawa et al. | |
| 2017/0077360 A1* | 3/2017 | Yang | H01L 33/32 |
| 2017/0130909 A1* | 5/2017 | Yeon | H01L 33/50 |
| 2017/0250324 A1 | 8/2017 | Seki et al. | |
| 2018/0108816 A1 | 4/2018 | Todorov et al. | |
| 2018/0154152 A1 | 6/2018 | Chabrol et al. | |
| 2019/0169496 A1 | 6/2019 | Moon et al. | |
| 2019/0174587 A1 | 6/2019 | Petluri et al. | |
| 2019/0254142 A1 | 8/2019 | Petluri et al. | |

FOREIGN PATENT DOCUMENTS

| | | |
|---|---|---|
| EP | 2629341 A1 | 8/2013 |
| EP | 3188262 B1 | 12/2018 |
| EP | 2629341 | 4/2020 |
| JP | 2013535531 A | 9/2013 |
| KR | 1020060101295 | 9/2006 |
| KR | 1020100038463 | 4/2010 |
| WO | 2013003166 A1 | 1/2013 |
| WO | 2015035425 A1 | 3/2015 |
| WO | 2015068513 A1 | 5/2015 |
| WO | 2016081340 A1 | 5/2016 |
| WO | 2016189216 A1 | 12/2016 |
| WO | 2019213644 A1 | 11/2019 |

OTHER PUBLICATIONS

EPO Search Opinion.
EPO Search Report.
Fluorescence Excitation Sources-Table 23.2, downloaded Mar. 9, 2020 from https://www.thermofisher.com/us/en/home/references/molecular-probes-the-handbook/tables/fluorescence-excitation-sources.html.
Fu, Sheng, et al.; "Effect of Al/Ga Substitution on the Structural and Luminescence Properties of Y3(Al1-XGax)5O12: Ce3+ Phosphors"; Optical Materials 75 (2018) 619-625; Nov. 22, 2017.
International Search Report.
International Search Report for PCT/US16/50008, filed Sep. 1, 2016, dated Dec. 29, 2016.
IPRP, PCT/US2019/030818, Nov. 2020.
Korean Office Action 10-2018-7010018 dated Mar. 3, 2020.
Office Action 201680065907.3, dated Nov. 4, 2019.
Office Action, dated Aug. 2020, CN 201680065907.3.
Piao, Xianqing, et al.; "Preparation of CaAlSiN3:Eu2+ Phosphors by the Self-Propagating High-Temperature Synthesis and Their Luminescent Properties"; Chemistry of Materials, 2007, 19, 4592-4599; Aug. 11, 2007.
Pulli, Tomi, et al.; "Advantages of White LED Lamps and New Detector Technology in Photometry," Light: Science & Applications, vol. 4, No. 9, 2015 (Jun. 1, 2015).
Written Opinion.
Written Opinion PCT/US2016/050008.
Office Action, dated Apr. 2021; CN201680065907.
EPO Search Opinion, EP18197817.
EPO Search Report, EP18197817.
Cn201980030173, Office Action, dated Jun. 30, 2023.

* cited by examiner

HIGH COLOR RENDERING WHITE LIGHT EMITTING DEVICES AND HIGH COLOR RENDERING PHOTOLUMINESCENCE COMPOSITIONS

CROSS-REFERENCE TO RELATED APPLICATIONS

This application is a continuation-in-part of U.S. patent application Ser. No. 15/256,252, filed Sep. 2, 2016, which in turn claims the benefit of priority to U.S. provisional application Ser. No. 62/216,985, filed Sep. 10, 2015 and U.S. provisional application Ser. No. 62/344,930, filed Jun. 2, 2016. This application is also a continuation-in-part of U.S. patent application Ser. No. 16/403,723, filed May 6, 2019, which in turn claims the benefit of priority to U.S. provisional application Ser. No. 62/667,351, filed May 4, 2018. All of the above-referenced applications are hereby incorporated by reference in their entirety.

FIELD

Embodiments of the present invention are directed to light emitting devices comprising photoluminescence wavelength conversion materials. More particularly, although not exclusively, embodiments concern light emitting devices and photoluminescence compositions for generating high luminous efficacy white light with high color rendering properties including a General Color Rendering Index (CRI Ra) of at least 90.

BACKGROUND

White light emitting LEDs ("white LEDs") include one or more photoluminescence materials (typically inorganic phosphor materials), which absorb a portion of the blue light emitted by the LED and re-emit light of a different color (wavelength). Typically, the phosphor material(s) generate yellow to green light which combined with the portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps. LED lamps (bulbs) are often constructed from a small number of high-intensity white LEDs.

To generate white light with a high CRI Ra, for example 90 or higher, it is known to additionally include red and/or orange light emitting phosphors. The inclusion of orange and red phosphors can also be beneficial where it is required to generate "warm white" light, that is light with a lower Correlated Color Temperature (CCT), for example warm white light with a CCT of 2700 K to 3000 K. However, a problem with including red and/or orange to red phosphors is that while this improves color rendering it decreases the luminous efficacy (LE) and/or conversion efficiency (CE) of the device due to the broad emission spectrum of long peak emission wavelength red/orange to red phosphors.

The invention arose in an endeavor to improve the luminous efficacy and quality of light (such as improvements in CRI Ra, CRI R8, CRI R9,) for white light emitting devices that generate white light with a CRI Ra of at least 90 through use of a combination of broadband orange to red and narrowband red photoluminescence materials (phosphors).

SUMMARY OF THE INVENTION

Embodiments of the invention concern white light emitting devices that include wavelength conversion phosphors for general lighting.

In embodiments of the invention high color rendering light emitting devices and photoluminescence compositions comprising a combination of a yellow to green photoluminescence material, a broadband orange to red photoluminescence material, and a narrowband red photoluminescence material. In this patent specification: a "narrowband red photoluminescence material" refers to a material which, in response to stimulation by excitation light, generates light having a peak emission wavelength ($\lambda_{pe}$) from 625 nm to 635 nm, that is light in the red region of the visible spectrum and which has a full width at half maximum (FWHM) emission intensity of from about 5 nm to about 25 nm; a "broadband orange to red photoluminescence material" refers to a material which, in response to stimulation by excitation light, generates light having a peak emission wavelength ($\lambda_{pe}$) from 600 nm to 620 nm, that is light in the orange to red region of the visible spectrum and which has a full width at half maximum (FWHM) emission intensity from 70 nm to 80 nm; and a "yellow to green photoluminescence material" refers to a material which, in response to stimulation by excitation light, generates light having a peak emission wavelength ($\lambda_{pe}$) from 530 nm to 550 nm, that is light in the yellow to green region of the visible spectrum. The narrowband red photoluminescence materials can comprise a narrowband red phosphor and/or a red quantum dot (QD) material, for example a cadmium-containing (Cd-containing) QD. More particularly, although not exclusively, the narrowband red phosphor comprises a narrowband red manganese-activated fluoride phosphor, for example $K_2SiF_6:Mn^{4+}$ (KSF), $K_2GeF_6:Mn^{4+}$ (KGF) or $K_2TiF_6:Mn^{4+}$ (KTF).

According to an aspect of the invention a light emitting device comprises: a solid-state light emitter which generates blue excitation light with a dominant wavelength from 440 nm to 470 nm; a yellow to green photoluminescence material which generates light with a peak emission wavelength from 500 nm to 575 nm; a broadband orange to red photoluminescence material which generates light with a peak emission wavelength from 580 nm to 620 nm; and a narrowband red manganese-activated fluoride phosphor which generates light with a peak emission wavelength from 625 nm to 635 nm; wherein the device generates white light with a spectrum having a broad emission peak from about 530 nm to about 600 nm and a narrow emission peak, wherein the ratio of the peak emission intensity of the broad emission peak to the peak emission intensity of the narrow emission peak is at least 20%.

The broad emission peak is attributable to the combined emissions of the yellow to green and the broadband orange to red photoluminescence materials with the peak emission wavelength of the broad emission peak depending on the peak emission wavelengths of the yellow to green and broadband orange to red photoluminescence materials as well as the amount of broadband orange to red photoluminescence material relative to the amount of yellow to green photoluminescence material. For example, for lower color temperatures, e.g. warm white, the device will comprise a greater amount of broadband orange to red photoluminescence material and the peak emission wavelength of the broad emission peak will occur at longer wavelengths closer to peak emission wavelength of the broadband orange to red photoluminescence material. Conversely, at higher color temperatures, e.g. cool white, the device will comprise a lesser amount of broadband orange to red photoluminescence material, the peak emission wavelength of the broad emission peak will occur at a shorter wavelength closer to the peak emission wavelength of the yellow to green photoluminescence material.

The light emitting device can generate white light with a color temperature from about 2200K to 6500K and wherein: when said color temperature is from about 2200K to 2700K a ratio of the peak emission intensity of the broad emission peak to the peak emission intensity of the narrow emission peak is at least about 25%; when said color temperature is about 3000K a ratio of the peak emission intensity of the broad emission peak to the peak emission intensity of the narrow emission peak is at least about 30%; when said color temperature is about 4000K a ratio of the peak emission intensity of the broad emission peak to the peak emission intensity of the narrow emission peak is at least about 35%; when said color temperature is about 5000K a ratio of the peak emission intensity of the broad emission peak to the peak emission intensity of the narrow emission peak is at least about 40%; and when said color temperature is about 6500K a ratio of the peak emission intensity of the broad emission peak to the peak emission intensity of the narrow emission peak is at least about 50%.

According to another aspect of the invention a light emitting device comprises: a solid-state light emitter which generates blue excitation light with a dominant wavelength from 440 nm to 470 nm; a yellow to green photoluminescence material which generates light with a peak emission wavelength from 500 nm to 575 nm; a broadband orange to red photoluminescence material which generates light with a peak emission wavelength from 580 nm to 620 nm; and a narrowband red manganese-activated fluoride phosphor which generates light with a narrow peak emission wavelength from 625 nm to 635 nm; wherein the device generates white light with a spectrum that over a wavelength range from about 500 nm to about 600 nm has a maximum deviation between the normalized intensity of light emitted by the device compared with the normalized intensity of light of a black-body or standard illuminant is less than 0.3. In embodiments, over a wavelength range from about 500 nm to about 590 nm the maximum deviation between the normalized intensity of light emitted by the device compared with the normalized intensity of light of a black-body or standard illuminant is less than 0.2. In embodiments, over a wavelength range from about 500 nm to about 580 nm the maximum deviation between the normalized intensity of light emitted by the device compared with the normalized intensity of light of a black-body or standard illuminant is less than 0.1.

According to a further aspect of the invention a light emitting device comprises: a solid-state light emitter which generates blue excitation light with a dominant wavelength from 440 nm to 470 nm; a yellow to green photoluminescence material which generates light with a peak emission wavelength from 500 nm to 575 nm; a broadband orange to red photoluminescence material which generates light with a peak emission wavelength from 580 nm to 620 nm; and a narrowband red manganese-activated fluoride phosphor; wherein the device generates white light with a color temperature from 2200K to 6500K and a general CRI Ra of at least 90 and has a spectrum comprising a broad emission peak and a narrow emission peak wherein: when said color temperature is from about 2200K to about 2700K the broad emission peak is from about 590 nm to about 600 nm, when said color temperature is about 3000K the broad emission peak is from about 580 nm to about 590 nm; when said color temperature is about 4000K the broad emission peak is from about 570 nm to about 580 nm; and when said color temperature is about 5000K the broad emission peak is from about 550 nm to about 570 nm.

According to a yet further aspect of the invention a light emitting device comprises: a solid-state light emitter which generate blue excitation light with a dominant wavelength from 440 nm to 470 nm; a yellow to green photoluminescence material which generates light with a peak emission wavelength from 500 nm to 575 nm; a broadband orange to red photoluminescence material which generates light with a peak emission wavelength from 580 nm to 620 nm; and a narrowband red manganese-activated fluoride phosphor; wherein the device generates white light with a color temperature from 2200K to 6500K and a general CRI Ra of at least 90 and wherein: when said color temperature is about 2200K the device has a luminous efficacy from 330 lm/$W_{opt}$ to 345 lm/$W_{opt}$; when said color temperature is about 2700K the device has a luminous efficacy from 340 lm/$W_{opt}$ to 355 lm/$W_{opt}$; when said color temperature is about 3000K the device has a luminous efficacy from 343 lm/$W_{opt}$ to 358 lm/$W_{opt}$; when said color temperature is about 4000K the device has a luminous efficacy from 330 lm/$W_{opt}$ to 345 lm/$W_{opt}$; when said color temperature is about 5000K the device has a luminous efficacy from 325 lm/$W_{opt}$ to 330 lm/$W_{opt}$; and when said color temperature is about 6500K the device has a luminous efficacy from 310 lm/$W_{opt}$ to 325 lm/$W_{opt}$.

In accordance with aspects of the invention, there is also provided a photoluminescence composition comprising a combination of an orange to red photoluminescence material, a yellow to green photoluminescence material and a narrowband red photoluminescence material enables high color rendering light emitting devices to be implemented that produce white light meeting current lighting standards namely: CRI Ra ≥90 (Energy Star), CRI R8 minimum 72 (California Energy Commission Title 20 code) and CRI R9 minimum 50 (CEC Title 24 code). In accordance with an embodiment of the invention, there is envisaged a high color rendering photoluminescence composition comprising: an orange to red photoluminescence material with a peak emission wavelength from 600 nm to 620 nm with a full width at half maximum emission intensity from 70 nm to 80 nm; a yellow to green photoluminescence material with a peak emission wavelength from 530 nm to 550 nm; and a narrowband red photoluminescence material with a peak emission wavelength from 625 nm to 635 nm with a full width at half maximum emission intensity of about 25 nm.

Light emitting devices in accordance with embodiments of any aspect of the invention can be configured to generate white light with a color temperature in a range about 2700 K to about 6500K. In embodiments, the light emitting device generate white light with a CRI Ra of at least 90, a CRI R9 of at least 50, and/or a CRI R8 of at least 72. The light emitting device can be further characterized by having a luminous efficacy (LE) of at least 330 lm/$W_{opt}$, an LE of at least 340 lm/$W_{opt}$, or an LE of at least 350 lm/$W_{opt}$ depending on color temperature.

In the various aspects of the invention, and to optimize luminous efficacy, the broadband orange to red photoluminescence material may generate light with a peak emission wavelength from 610 nm to 620 nm, preferably about 615 nm. The broadband orange to red photoluminescence material can comprise a calcium aluminum silicon nitride based phosphor of general composition (Sr,Ca)AlSiN$_3$:Eu, a nitride-based phosphor of general composition Ba$_2$_

$_x$Sr$_x$Si$_5$N$_8$:Eu, or a silicate-based phosphor of general composition (Sr,Ba,Y)$_3$(Si,Al)O$_5$:Eu.

In the various aspects of the invention, the yellow to green photoluminescence material may generate light with a peak emission wavelength selected from the group consisting of: from 530 nm to 540 nm, about 535 nm, from 540 nm to 545 nm, and about 543 nm. The yellow to green photoluminescence material may comprise a cerium-activated garnet phosphor of general composition (Y,Lu)$_3$(Al,Ga)$_5$O$_{12}$:Ce; of general composition Y$_3$(Al,Ga)$_5$O$_{12}$:Ce; and/or of general composition Lu$_3$Al$_5$O$_{12}$:Ce.

In the various aspects of the invention, the manganese-activated fluoride phosphor can comprise K$_2$SiF$_6$:Mn$^{4+}$, K$_2$GeF$_6$:Mn$^{4+}$, K$_2$TiF$_6$:Mn$^{4+}$, K$_2$SnF$_6$:Mn$^{4+}$, Na$_2$TiF$_6$:Mn$^{4+}$, Na$_2$ZrF$_6$:Mn$^{4+}$, Cs$_2$SiF$_6$:Mn$^{4+}$, Cs$_2$TiF$_6$:Mn$^{4+}$, Rb$_2$SiF$_6$:Mn$^{4+}$, and/or Rb$_2$TiF$_6$:Mn$^{4+}$.

In the various aspects of the invention said light emitting device can generate white light with a color temperature of 2700K to 5000K, a CRI Ra of at least 90, a CRI R9 from 50 to 70, and a luminous efficacy from 330 lm/W$_{opt}$ to 355 lm/W$_{opt}$.

In embodiments, it may be that the broadband orange to red photoluminescence material comprises a calcium aluminum silicon nitride based phosphor of general composition (Sr,Ca)AlSiN$_3$:Eu, the yellow to green photoluminescence material comprises a cerium-activated garnet phosphor of general composition Y$_3$(Al,Ga)$_5$O$_{12}$:Ce, and the manganese-activated fluoride phosphor comprises has a composition K$_2$SiF$_6$:Mn$^{4+}$ and generates light with a peak emission wavelength from 630 nm to 632 nm.

It may be that the amount of broadband orange to red photoluminescence material comprises about 1 wt % to about 10 wt % of the combined weight of the broadband orange to red photoluminescence material and narrowband red manganese-activated fluoride phosphor.

In the various aspects of the invention the yellow to green photoluminescence material, broadband orange to red photoluminescence material, and the narrowband red manganese-activated fluoride phosphor comprise a mixture in for example a single layer. In other embodiments, the photoluminescence materials/phosphor can be provided in separate locations such as, for example, in separate respective regions (e.g. layers) of a single component or in separate components. For light emitting devices, the photoluminescence materials can be provided in the form of an encapsulating layer on the one or more solid-state light emitters (e.g. LEDs). Alternatively, the light emitting device can comprise a "remote phosphor" configuration in which the photoluminescence materials are provided in a separate component that is located remotely (in spaced separation) to the excitation sources and may be separated by an air gap or other medium. The device may comprise a light transmissive material (optical medium) with an index of refraction of 1.40 to 1.43, such as for example, a methyl-based silicone such as dimethylsiloxane or polydimethylsiloxane that incorporates at least the narrowband red manganese-activated fluoride phosphor. In embodiments the yellow to green photoluminescence material, broadband orange to red photoluminescence material and narrowband red manganese-activated fluoride phosphor can be incorporated as a mixture in the light transmissive material (optical medium). Inclusion of at least the narrowband red manganese-activated fluoride phosphor in such an optical medium can improve luminous efficacy as well as reducing usage of the narrowband red manganese-activated fluoride phosphor and reduce cost of the device.

DESCRIPTION OF THE DRAWINGS

In order that the present invention is better understood a LED-based white light emitting devices and photoluminescence compounds in accordance with the invention will now be described, by way of example only, with reference to the accompanying drawings in which like reference numerals are used to denote like parts, and in which.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Embodiments of the invention concern high color rendering light emitting devices and photoluminescence compositions comprising a combination (typically a mixture) of an orange to red-emitting photoluminescence material, a yellow to green-emitting photoluminescence material and a narrowband red-emitting photoluminescence material. In this patent specification a "narrowband red photoluminescence" material refers to a material which generates light having a peak emission wavelength ($\lambda_{pe}$) from 625 nm to 635 nm, that is in the red region of the visible spectrum and a FWHM from about 5 nm to about 25 nm; an "orange to red photoluminescence material" refers to a material which, in response to stimulation by excitation light, generates light having a peak emission wavelength ($\lambda_{pe}$) from 580 nm to 620 nm, that is light in the orange to red region of the visible spectrum and which has a full width at half maximum (FWHM) emission intensity of greater than about 70 nm and less than 80 nm (from 70 nm to 80 nm); and a "yellow to green photoluminescence material" refers to a material which, in response to stimulation by excitation light, generates light having a peak emission wavelength ($\lambda_{pe}$) from 500 nm to 575 nm; that is light in the yellow to green region of the visible spectrum.

Figure 1:
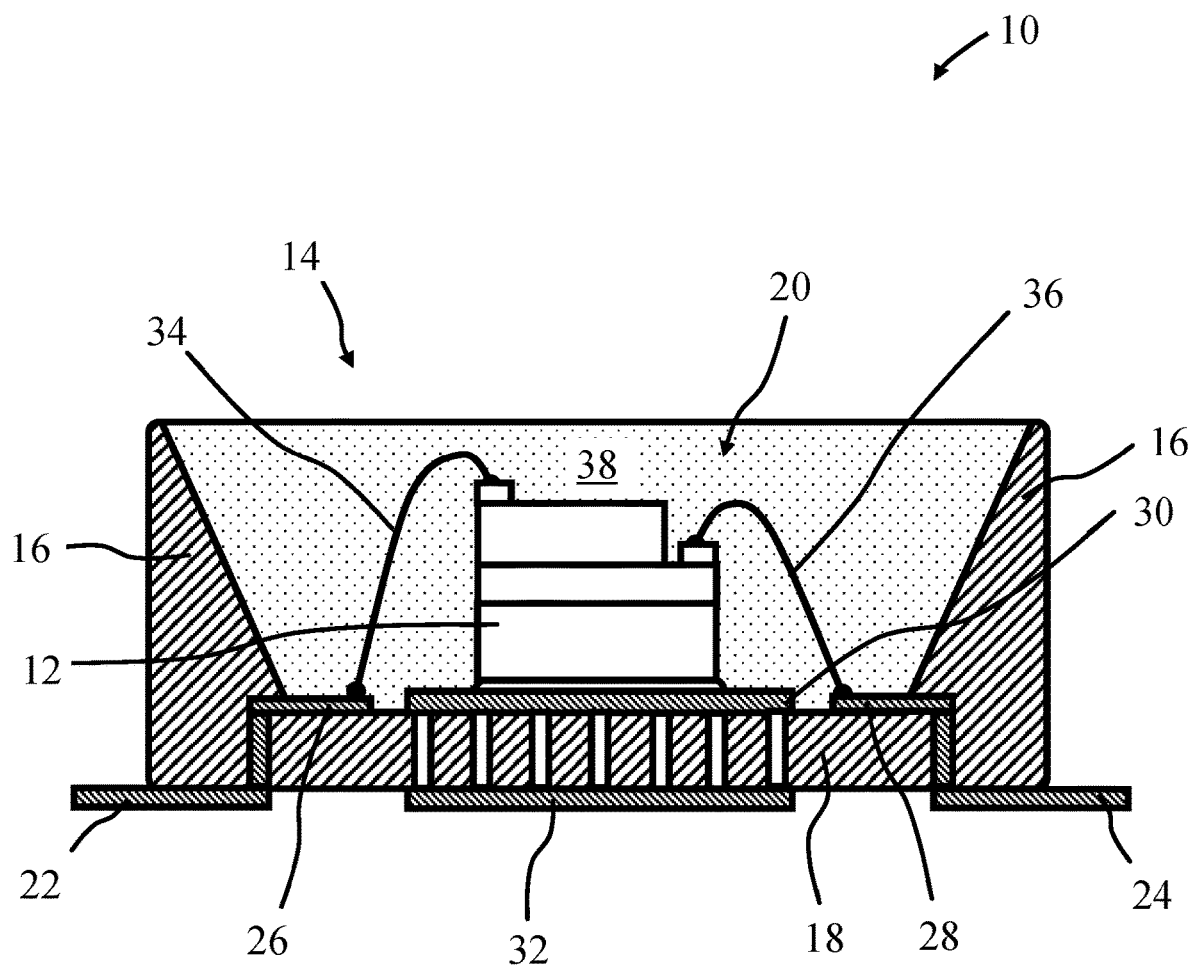
FIG. 1 is schematic representation of an LED-based white light emitting device in accordance with an embodiment of the invention.

FIG. 1 is a schematic representation of a white light emitting device 10, according to an embodiment of the invention. The device 10 is configured to generate warm white light with a CCT (Correlated Color Temperature) from about 2700 K to about 6500K and a General Color Rendering Index (CRI Ra) of at least 90 (i.e. 90 and higher).

The device 10 can comprise one or more blue-emitting GaN (gallium nitride)-based LED chips 12 that are housed within a package 14. The one or more LED chips are operable to generate blue light with a dominant wavelength from 440 nm to 470 nm, typically from 450 nm to 470 nm. The package, which can for example comprise Surface Mountable Device (SMD) such as an SMD 2835 OR SMD 5630 LED package, comprises upper and lower body parts 16, 18. The upper body part 16 defines a recess 20 which is configured to receive the one or more LED chips 12. The package further comprises electrical connectors 22 and 24 on the base that are electrically connected to corresponding electrode contact pads 26 and 28 on the floor of the recess 20. Using adhesive or solder, the LED chip(s) 12 can be mounted to a thermally conductive pad 30 located on the floor of the recess 20. The thermally conductive pad 30 is thermally connected to a thermally conductive pad 32 on the base of the package. The LED chip's electrode pads are electrically connected to corresponding electrode contact pads 26 and 28 on the floor of the package using bond wires 34 and 36 and the recess 20 is completely filled with a transparent silicone 38 which, in accordance with embodiments of the invention, is loaded with a mixture of a yellow to green-emitting phosphor, orange to red-emitting phosphor and a red-emitting manganese-activated fluoride phosphor such that the exposed surfaces of the LED chip 12 are covered by the phosphor/silicone material mixture. To enhance the emission brightness of the device the walls of the recess 20 are inclined and have a light reflective surface.

Yellow to Green-Emitting Photoluminescence Materials

In this patent specification, a yellow to green photoluminescence material refers to a material which generates light having a peak emission wavelength ($\lambda_{pe}$) from about 500 nm to about 575 nm (more typically from 530 nm to 550 nm), that is in the yellow to green region of the visible spectrum. Preferably, the yellow to green photoluminescence material has a broad emission characteristic and preferably has a FWHM of ~100 nm or wider. The yellow to green photoluminescence material can comprise any photoluminescence material, such as for example a garnet-based inorganic phosphor such as YAG or LuAG or a silicate-based phosphor. In embodiments, the yellow to green photoluminescence materials comprises a cerium-activated yttrium aluminum garnet phosphor of general composition $Y_3(Al,Ga)_5O_{12}$:Ce (YAG) such as for example a YAG series phosphor from Intematix Corporation, Fremont California, USA which have a peak emission wavelength from 527 nm to 543 nm and a FWHM of ~120 nm. In this patent specification, the notation YAG# represents the phosphor type—YAG-based phosphors—followed by the peak emission wavelength in nanometers (#). For example, YAG535 denotes a YAG phosphor with a peak emission wavelength of 535 nm. The yellow to green photoluminescence material may comprise a cerium-activated yttrium aluminum garnet phosphor of general composition $(Y,Ba)_3(Al,Ga)_5O_{12}$:Ce (YAG) such as for example a GNYAG series phosphor from Intematix Corporation, Fremont California, USA. In some embodiments the yellow to green-emitting phosphor can comprise a green-emitting LuAG-based phosphor as taught in U.S. Pat. No. 8,529,791 entitled "Green-Emitting, Garnet-Based Phosphors in General and Backlighting Applications" which is hereby incorporated in its entirety. Such a green-emitting phosphor comprises a cerium-activated, green-emitting lutetium aluminate phosphor of general composition $Lu_3Al_5O_{12}$:Ce (GAL) comprising lutetium, cerium, at least one alkaline earth metal, aluminum, oxygen, and at least one halogen. The phosphor is configured to absorb excitation radiation having a wavelength ranging from about 380 nm to about 480 nm, and to emit light having a peak emission wavelength $\lambda_{pe}$ ranging from about 500 nm to about 550 nm. Examples of such phosphors include for example the GAL series of phosphor from Intematix Corporation, Fremont California, USA which have a peak emission wavelength from 516 nm to 560 nm and a FWHM of ~120 nm. In this patent specification, the notation GAL# represents the phosphor type (GAL)—LuAG-based phosphors—followed by the peak emission wavelength in nanometers (#). For example, GAL535 denotes a GAL phosphor with a peak emission wavelength of 535 nm.

Examples of silicate phosphors include europium activated ortho-silicate phosphors of general composition $(Ba,Sr)_2SiO_4$:Eu such as for example G, EG, Y and EY series of phosphors from Intematix Corporation, Fremont Calif., USA which have a peak emission wavelength from 507 nm to 570 nm and a FWHM of ~70 nm to ~80 nm. Examples of suitable yellow to green phosphors are given in TABLE 1.

TABLE 1

Example yellow to green photoluminescence materials

| Phosphor | General Composition | | Wavelength $\lambda_{pe}$ (nm) | FWHM (nm) |
|---|---|---|---|---|
| YAG | $Y_{3-x}(Al_{1-y}Ga_y)_5O_{12}:Ce_x$ | $0.01 < x < 0.2$ & $0 < y < 2.5$ | 520-550 | ≥100 |
| GNYAG | $(Y, Ba)_{3-x}(Al_{1-y}Ga_y)_5O_{12}:Ce_x$ | $0.01 < x < 0.2$ & $0 < y < 2.5$ | 520-550 | ≥100 |
| LuAG | $Lu_{3-x}(Al_{1-y}M_y)_5O_{12}:Ce_x$ | $0.01 < x < 0.2$ & $0 < y < 1.5$ M = Mg, Ca, Sr, Ba, Ga, | 500-550 | ≈120 |
| LuAG | $Lu_{3-x}(Al_{1-y}Ga_y)_5O_{12}:Ce_x$ | $0.01 < x < 0.2$ & $0 < y < 1.5$ | 500-550 | ≈120 |
| Silicate | $A_2SiO_4:Eu$ | A = Mg, Ca, Sr, Ba | 500-550 | 70-80 |
| Silicate | $(Sr_{1-x}Ba_x)_2SiO_4:Eu$ | $0.3 < x < 0.9$ | 500-550 | 70-80 |

Broadband Orange to Red-Emitting Photoluminescence Materials

The broadband orange to red-emitting photoluminescence material can comprise any photoluminescence material, typically a phosphor in particulate form, that is excitable by blue light and emits light with a peak emission wavelength ($\lambda_{pe}$) from about 580 nm to about 620 nm (typically from about 600 nm to about 620 nm) and which has a full width at half maximum (FWHM) emission intensity of greater than about 70 nm and less than 80 nm and may include for example a europium activated silicon nitride-based phosphor, α-SiAlON or a silicate phosphor. For the sake of brevity the "broadband orange to red-emitting photoluminescence material" will be referred to as "orange to red phosphor". Examples of such orange to red phosphors are given in TABLE 2.

Figure 2:
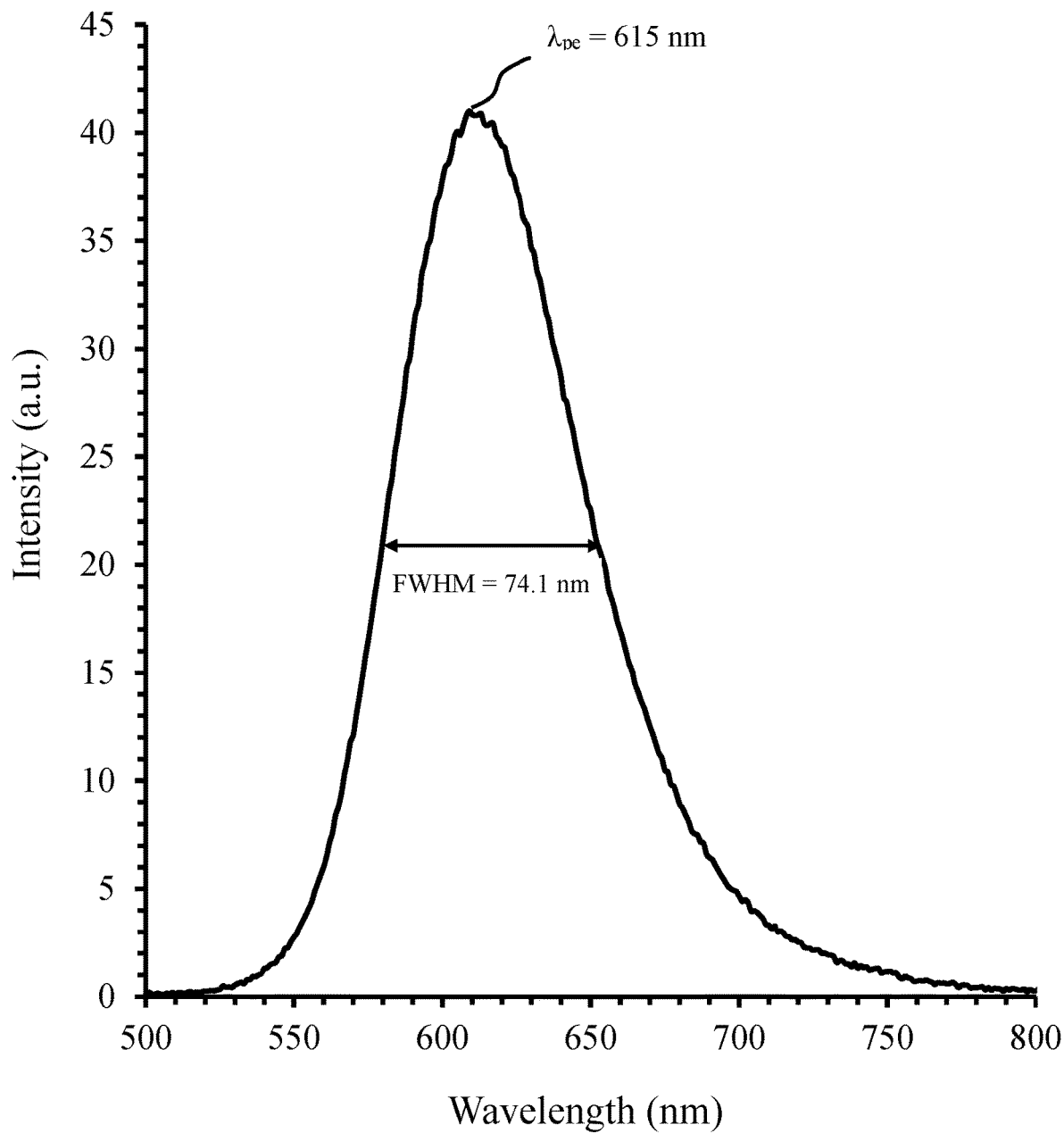
FIG. 2 is an emission spectrum, intensity (a.u.) versus wavelength (nm), for CASN615 phosphor (Sr,Ca)AlSiN$_3$:Eu$^{2+}$.

In some embodiments, the orange to red phosphor comprises a Calcium Aluminum Silicon Nitride phosphor (CASN) of general formula $CaAlSiN_3:Eu^{2+}$. The CASN phosphor can be doped with other elements such as strontium (Sr), general formula $(Sr,Ca)AlSiN_3:Eu^{2+}$. The CASN phosphor has a peak emission wavelength ($\lambda_{pe}$) from about 600 nm to about 620 nm and has a full width at half maximum emission intensity of greater than 70 nm and less than 80 nm, more typically greater than or equal to 73 nm and less than or equal to 78 nm. In this patent specification, the notation CASN# represents the phosphor type (CASN) followed by the peak emission wavelength ($\lambda_{pe}$) in nanometers (#). For example, CASN615 denotes a CASN phosphor with a peak emission wavelength of 615 nm. FIG. 2 shows an emission spectrum, intensity (a.u.) versus wavelength (nm) for CASN615 phosphor. CASN615 has a peak emission wavelength $\lambda_{pe}$=615 nm with a FWHM of approximately 74.1 nm, that is less than 80 nm. CASN phosphors with a peak emission wavelength from 610 nm to 620 nm have a FWHM in a range greater than or equal to 73 nm and less than or equal to 78 nm.

In embodiments, the orange to red phosphor can comprise a nitride-based phosphor as taught in U.S. Pat. No. 8,597,545 entitled "Red-Emitting Nitride-Based Calcium-Stabilized Phosphors" which is hereby incorporated in its entirety. Such a nitride-based phosphor has a composition represented by the chemical formula $M_aSr_bSi_cAl_dN_eEu_f$, wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein a+b+f>2+d/v and v is the valence of M.

Alternatively, the orange to red phosphor can comprise a nitride-based phosphor as taught in U.S. Pat. No. 8,663,502 entitled "Red-Emitting Nitride-Based Phosphors" which is hereby incorporated in its entirety. Such a red emitting phosphor comprises a nitride-based composition represented by the chemical formula $M_{(x/v)}M'_2Si_{5-x}Al_xN_8:RE$, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x \leq 0.4$, and wherein said red-emitting phosphor has the general crystalline structure of $M'_2Si_5N_8:RE$, Al substitutes for Si within said general crystalline structure, and M is located within said general crystalline structure substantially at the interstitial sites. Examples of such nitride phosphors are the XR series of phosphors from Intematix Corporation, Fremont California, USA, for example XR600 which has a peak emission wavelength of 600 nm and a FWHM of about 78 nm and XR610 which has a peak emission wavelength of 610 nm and a FWHM of about 79 nm.

TABLE 2

Example orange to red-emitting photoluminescence materials

| Phosphor | General Composition | | Wavelength $\lambda_{pe}$ (nm) | FWHM (nm) |
|---|---|---|---|---|
| α-SiAlON | $Ca_{(x/2)}Si_{12-x}Al_xN_{16}:Eu$ | $0 < x < 6$ | 580-610 | >70 |
| α-SiAlON | $M_xSi_{12-(m+n)}Al_{m+n}O_nN_{16-n}:Eu$ | M = Ca, Sr, Y . . . ; $x < 2$ | 580-600 | >70 |
| CASN | $(Ca_{1-x}Sr_x)AlSiN_3:Eu$ | $0.5 < x \leq 1$ | 600-620 | 73-78 |
| 258 nitride | $Ba_{2-x}Sr_xSi_5N_8:Eu$ | $0 \leq x \leq 2$ | 580-620 | 79 |
| Silicate | $(Sr, Ba, Y)_3(Si, Al)O_5:Eu$ | | 600-620 | 79 |

Narrowband Red Photoluminescence Materials

As herein described a narrowband red photoluminescence material can comprise a narrowband red phosphor and/or a red quantum dot (QD) material which, in response to stimulation by excitation light, generates light having a peak emission wavelength from 625 nm to 635 nm; that is light in the red region of the visible spectrum and which has a maximum full width at half maximum (FWHM) emission intensity of about 20 nm, more particularly from about 4 nm to about 20 nm.

Narrowband Red Phosphors: Manganese-Activated Fluoride Phosphors

Figure 3:
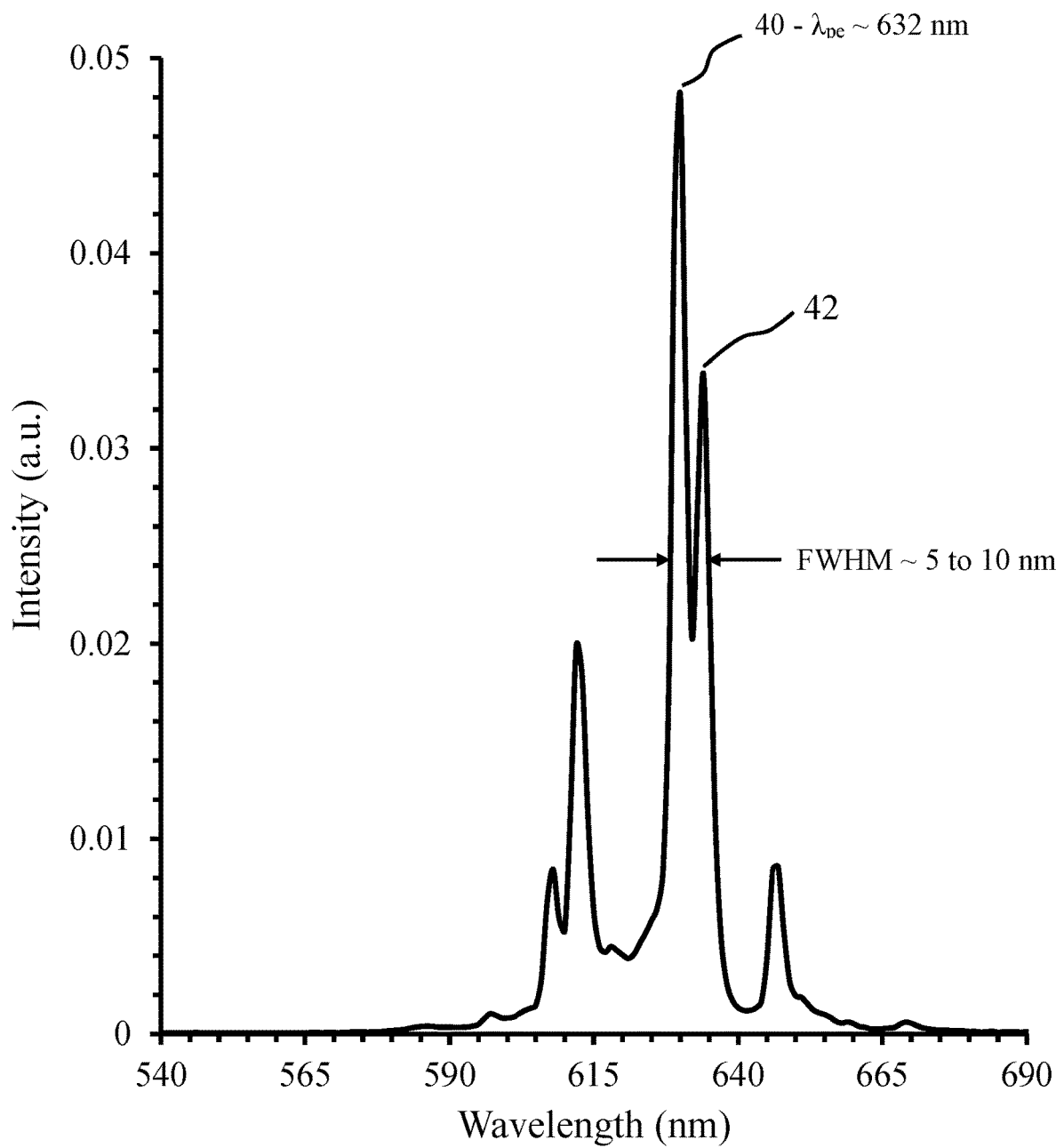
FIG. 3 is an emission spectrum, intensity (a.u.) versus wavelength (nm), for K$_2$SiF$_6$:Mn$^{4+}$ (KSF) narrowband red phosphor.

Narrowband red phosphors can include manganese-activated fluoride phosphors (i.e. $Mn^{4+}$ doped). An example of a manganese-activated fluoride phosphor is manganese-activated potassium hexafluorosilicate phosphor—$K_2SiF_6$:$Mn^{4+}$ (KSF). An example of such a phosphor is NR6931 KSF phosphor from Intematix Corporation, Fremont California, USA which has a peak emission wavelength $\lambda_{pe}$ of about 632 nm (i.e. wavelength of the main/highest intensity peak). FIG. 3 shows the emission spectrum, intensity (a.u.) versus wavelength (nm), of NR6931 KSF phosphor. As can be seen from FIG. 3 manganese-activated fluoride phosphors have a emission spectrum composed of a main emission peak 40 and multiple satellite peaks. KSF phosphor is excitable by blue excitation light and generates red light with a peak emission wavelength ($\lambda_{pe}$) of between about 631 nm and about 632 nm with a FWHM of ~4.7 nm to ~10 nm (depending on the way it is measured: i.e. whether the width takes account of the main peak 40 only or includes the satellite peak 42 at about 635 nm—FIG. 3). Other manganese-activated phosphors can include: $K_2GeF_6$:$Mn^{4+}$ (KGF), $K_2TiF_6$:$Mn^{4+}$ (KTF), $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, and $Rb_2TiF_6$:$Mn^{4+}$.

Narrowband Red Photoluminescence Materials: Red Quantum Dots (QDs)

A quantum dot (QD) is a portion of matter (e.g. semiconductor) whose excitons are confined in all three spatial dimensions that may be excited by radiation energy to emit light of a particular wavelength or range of wavelengths. The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e. a relatively longer wavelength). Narrowband red QDs generate light with a FWHM emission intensity in a range 4 nm to about 25 nm.

The QD materials can comprise core/shell nano-crystals containing different materials in an onion-like structure. For example, the above-described exemplary materials can be used as the core materials for the core/shell nano-crystals. The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium.

Narrowband red QDs can comprise different materials and typically comprise cadmium-based QDs in order to achieve a FWHM emission intensity in a range 5 nm to about 20 nm. In the case of cadmium-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Examples of Cd containing narrowband red QDs are given in TABLE 3.

TABLE 3

| Narrowband Red QD composition | |
|---|---|
| CdSe ~4.2 nm | cadmium selenide |
| $Cd_xZn_{1-x}Se$ | cadmium zinc selenide |
| CdZnSeS | cadmium zinc selenium sulfide |
| $CdSe_xS_{1-x}$ | cadmium selenium sulfide |
| CdTe | cadmium telluride |
| $CdTe_xS_{1-x}$ | cadmium tellurium sulfide |

In accordance with an embodiment of the invention the material into which the mixture of phosphor materials is incorporated can comprise a light transmissive material with an index of refraction n=1.40 to 1.43. For example the light transmissive material can comprise a dimethyl-based silicone such as a polydimethylsiloxane (PDMS). An example of such a suitable silicone material is OE-6370 HF optical encapsulant from Dow Corning.

Figure 4:
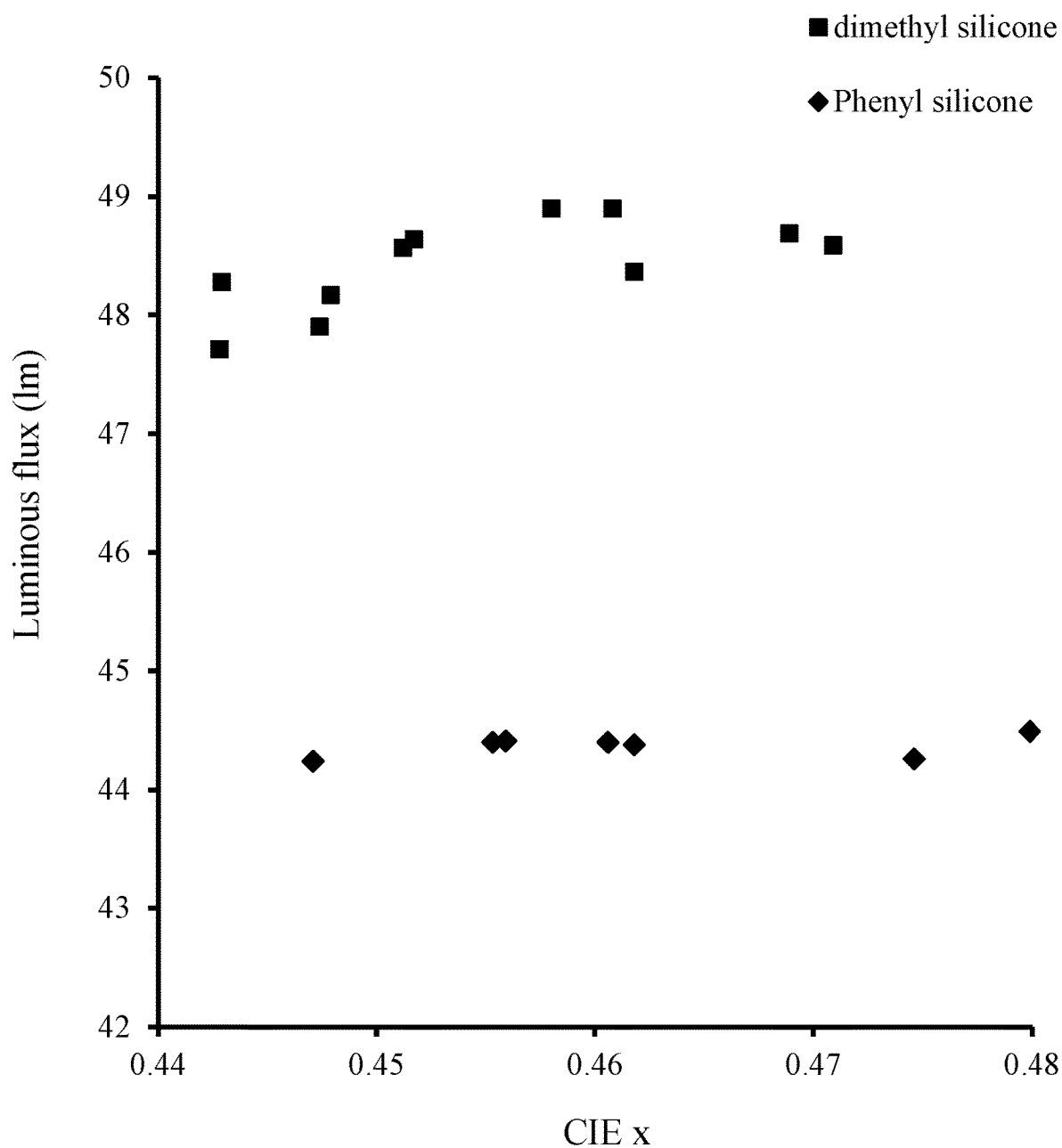
FIG. 4 is a plot of luminous flux versus CIE x for LED-based white light emitting devices for which a) the phosphors are incorporated as a mixture in a phenyl-based silicone and b) the phosphors are incorporated as a mixture in a dimethyl-based silicone.

FIG. 4 is a plot of luminous flux versus CIE x for an LED-based white light emitting device in accordance with the invention (■ designated dimethyl silicone OE-6370HF). The variation in CIE x results from different loadings of the phosphor mixture within the silicone. For comparison, data is shown for an identical device in which the same phosphor mixture is incorporated within a phenyl-based silicone (♦ designated phenyl silicone). The phenyl-based silicone used in these devices is OE-6650 optical encapsulant from Dow Corning. Phenyl-based silicone encapsulants are typically used to encapsulate phosphor within LED devices.

FIG. 4 shows that by using a dimethyl-based silicone as the phosphor encapsulant results in about a 10% increase in luminous flux from the device as compared with the same device that uses a phenyl-based silicone as the phosphor encapsulant. It is believed that the increase in luminous flux results from the lower index of refraction (n≈1.4) of the dimethyl-based silicone compared with the index of refraction (n≈4.54) for a phenyl-based silicone. This lower index of refraction is believed to increase red light extraction from the red-emitting manganese-activated potassium hexafluorosilicate (KSF) phosphor which typically have an index of refraction ($K_2SiF_6$:$Mn^{4+}$–n=1.3991) by reducing total internal reflection at the interface of the phosphor particle and surrounding optical medium (silicone). For comparison, the index of refraction for other phosphors (including the yellow to green-emitting LuAGs and orange-emitting nitrides) is typically around 1.8 which may account for the widespread use of phenyl-based silicone encapsulants in LED-based light-emitting devices. It might be expected that the use of a dimethyl-based silicone would have a detrimental effect on light emission from phosphors other than the red-emitting manganese-activated potassium hexafluorosilicate phosphor (KSF) and degrade the overall performance of the device. However, as shown FIG. 4 when using a red-emitting manganese-activated fluoride phosphor in combination with other phosphor the net result is an increase in luminous flux. The increase in luminous flux is found to be greater when a majority (i.e. more than 50% by weight) of the total phosphor comprises a red-emitting manganese-activated fluoride phosphor. In other embodiments the yellow to green-emitting, orange to red-emitting (when present) and KSF phosphors can be incorporated as a mixture in other light transmissive materials with an index of refraction of about 1.40 to about 1.43 such as for example a light transmissive epoxy resin.

Device Dev.1A: CCT 2700 K and CRI (Ra) ≥90 White Light Emitting Device

TABLES 4A and 4B tabulate details of a white light emitting device designated Dev.1 which is configured to generate white light with a nominal CCT of 2700 K and a General CRI Ra of 90 and higher.

TABLE 4A

| Device | Yellow to green phosphor (Wavelength $\lambda_p$) | KSF phosphor (Wavelength $\lambda_p$) | Encapsulant |
|---|---|---|---|
| Dev.1 | NYAG4454 (558 nm) | NR6931 KSF (632 nm) | OE-6370 HF dimethyl |

Device Dev.1 comprises a SMD 5630 LED package that contains a single 451 nm GaN LED chip with a mixture of two phosphors: (i) a yellow to green-emitting phosphor (Intematix's NYAG4454 cerium-activated green-emitting YAG phosphor) and (ii) a red-emitting manganese-activated fluoride phosphor (Intematix NR6931 KSF). The mixture of phosphors is incorporated in, and homogeneously distributed throughout, a dimethyl-based silicone (Dow Corning OE-6370 HF optical encapsulant). The proportion of KSF phosphor of the total phosphor weight is 86.5 wt % with the remaining 3.5 wt % comprising NYAG4454 (TABLE 4B).

TABLE 4B

| Device | Yellow to green phosphor (wt %) | KSF phosphor (wt %) | Total phosphor content per 100 g silicone (g) |
|---|---|---|---|
| Dev.1 | 3.5 | 86.5 | 100 |

TABLE 4C tabulates the optical characteristics of the white light emitting device, Dev. 1. As can be seen from the table the device generate white light with a CCT≈2700 K, a General CRI Ra of 90 and greater, and a CRI R9 of greater than 90. Further as can be seen from TABLE 4C, Dev.1 has a Luminous Efficacy (LE) of 335 lm/W$_{opt}$. Unless specified otherwise, in this specification, luminous efficacy (LE) is the ratio of luminous flux to radiant flux and has the units lm/W$_{opt}$. It is also known as Luminous Efficacy of Radiation (LER).

TABLE 4C

| Device | Luminous Flux (lm) | CIE x | CIE y | CCT (K) | CRI Ra | CRI R9 | LE (lm/W$_{opt}$) |
|---|---|---|---|---|---|---|---|
| Dev.1 | 54.0 | 0.4587 | 0.4134 | 2738 | 90.4 | 93.2 | 335 |

Devices Dev.2-10: CCT 2700 K and CRI Ra ≥95 White Light Emitting Devices

TABLE 5A tabulates details of various white light emitting devices designated Dev.2-10. Dev.2-10 are nominally the same device and each is configured to generate white light with a nominal CCT of 2700 K and a General CRI Ra of 95 and higher.

TABLE 5A

| Device | Yellow to green phosphor (wt %) | KSF phosphor (wt %) | Orange to red phosphor (wt %) |
|---|---|---|---|
| Devs.2-10 | 15 | 82 | 3 |

Each device comprises a SMD 5630 LED package that contains a single 451 nm GaN LED chip with a mixture of three phosphors: (i) a yellow to green-emitting phosphor (Intematix's GAL540 cerium-activated green-emitting LuAG phosphor), (ii) a red-emitting manganese-activated fluoride phosphor (Intematix NR6931 KSF), and (iii) an orange to red-emitting phosphor (Intematix XR600 nitride-based phosphor). The mixture of phosphors is incorporated in, and homogeneously distributed throughout, a dimethyl-based silicone (Dow Corning OE-6370 HF optical encapsulant). The proportion of red phosphor (XR600+KSF) of the total phosphor weight is 85 wt % with the remaining 15 wt % comprising GAL540 (TABLE 4A). The proportion of KSF is 82 wt % and the proportion of XR600 is 3 wt %.

TABLE 5B tabulates the optical characteristics of the white light emitting devices, Devs.2-10. As can be seen from the table each device generates white light with a CCT≈2700 K, a General CRI Ra of 95 and greater, and a CRI R9 of greater than 92. Further as can be seen from TABLE 4B the devices have a Luminous Efficacy (LE) ranging from 334 lm/W$_{opt}$ to 339 lm/W$_{opt}$ and an average LE of 335 lm/W$_{opt}$.

Figure 5:
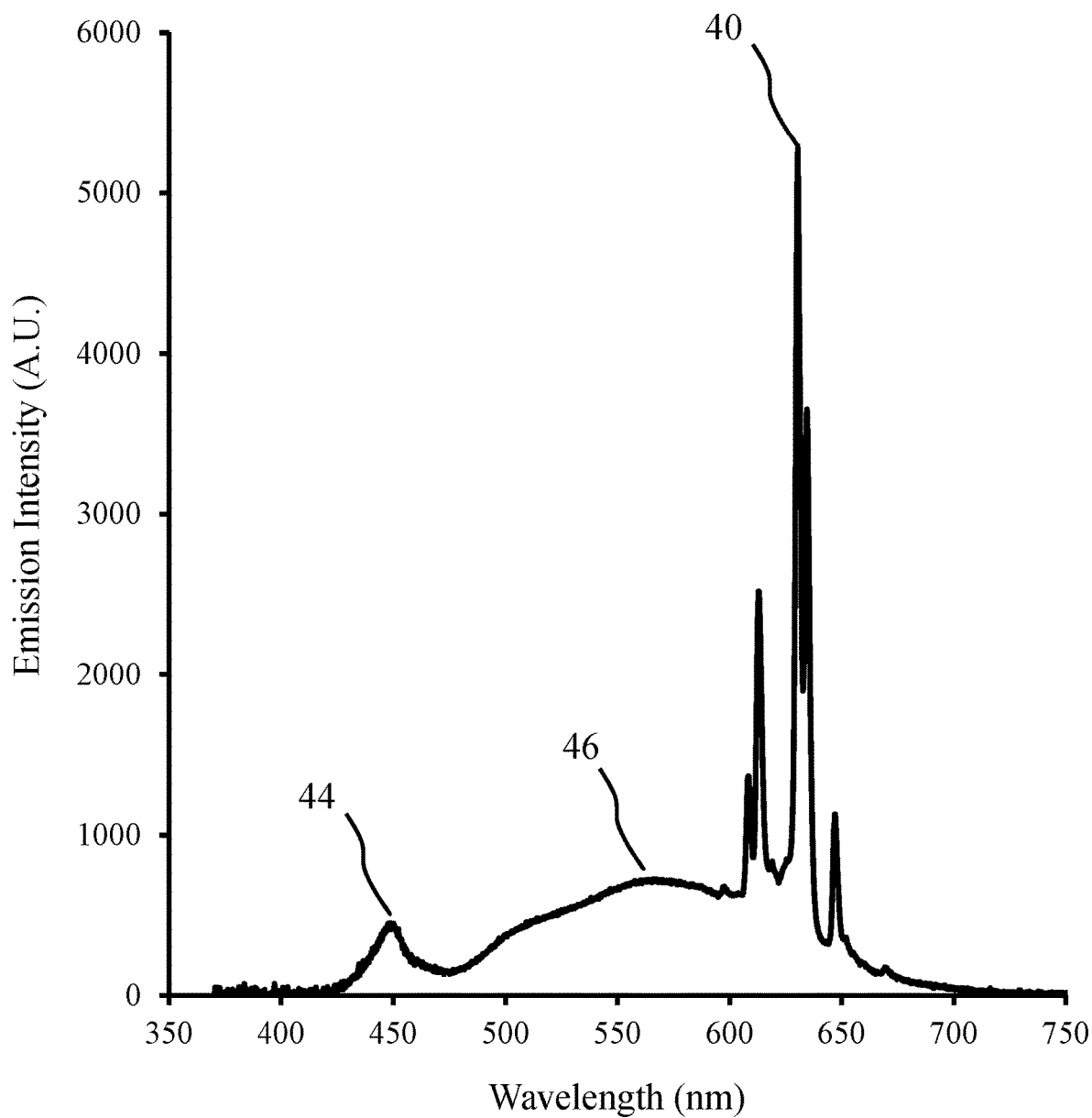
FIG. 5 is an emission spectrum, intensity (a.u.) versus wavelength (nm), for an LED-based white light emitting device in accordance with an embodiment of the invention.

FIG. 5 is an emission spectrum, intensity (a.u.) versus wavelength (nm), for one of the devices of TABLE 5B. As can be seen from the FIG. 5 the emission spectrum is composed of a peak 44 corresponding to blue excitation light from the LED; a broad emission peak 44 with a peak emission wavelength of about 570 nm attributable to the combined emissions of the yellow to green phosphor and broadband orange to red phosphor; and multiple peaks (main peak 40 and satellite peaks) in the red region of the spectrum attributable to the KSF.

TABLE 5B

| Device | Luminous Flux (lm) | CIE x | CIE y | LE (lm/W$_{opt}$) | CCT (K) | CRI Ra | CRI R9 |
|---|---|---|---|---|---|---|---|
| Dev.2 | 49.46 | 0.4576 | 0.4048 | 338.9 | 2686 | 96.1 | 92.7 |
| Dev.3 | 48.72 | 0.4560 | 0.4032 | 338.1 | 2696 | 95.9 | 92.4 |
| Dev.4 | 49.07 | 0.4581 | 0.4103 | 335.9 | 2722 | 95.6 | 95.7 |
| Dev.5 | 49.36 | 0.4565 | 0.4067 | 334.4 | 2717 | 94.8 | 96.7 |
| Dev.6 | 49.59 | 0.4564 | 0.4106 | 336.4 | 2748 | 95.6 | 96.0 |
| Dev.7 | 49.17 | 0.4567 | 0.4064 | 333.7 | 2712 | 95.3 | 95.7 |
| Dev.8 | 48.99 | 0.4566 | 0.4069 | 333.9 | 2717 | 95.3 | 96.3 |
| Dev.9 | 49.17 | 0.4599 | 0.4081 | 333.7 | 2680 | 95.0 | 96.3 |
| Dev.10 | 49.15 | 0.4590 | 0.4090 | 335.1 | 2699 | 95.4 | 95.3 |
| Average | 49.19 | 0.4574 | 0.4073 | 335.6 | 2709 | 95.4 | 95.2 |

Devices Dev.11 (Ref), Dev.12 and Dev.13: CCT 3000 K, CRI Ra ≥95 and CRI R9 ≥90 White Light Emitting Devices TABLES 6A and 6B tabulate details of various white light emitting devices designated Dev.11 (ref), Dev.12 and Dev.13. Each Device is configured to generate warm white light with a CCT of approximately 3000 K and comprises a SMD 2835 LED package that contains a single 451 nm GaN LED chip.

TABLE 6A

| Device | Yellow to green phosphor (Wavelength λ$_p$) | KSF phosphor (Wavelength λ$_p$) | Orange to red phosphor (Wavelength λ$_p$) | Encapsulant |
|---|---|---|---|---|
| Dev.11 (ref) | GAL535 (535 nm) | NR6931 KSF (632 nm) | — | OE-6370 HF dimethyl |
| Dev.12 | GAL540 (540 nm) | NR6931 KSF (632 nm) | XR600 (600 nm) | OE-6370 HF dimethyl |
| Dev.13 | GAL540 (540 nm) | NR6931 KSF (632 nm) | XR600 (600 nm) | OE-6636 phenyl |

Device Dev.11 (ref) comprises a mixture of two phosphors: (i) a yellow to green-emitting phosphor (Intematix's GAL535 cerium-activated green-emitting LuAG phosphor) and (ii) a red-emitting manganese-activated fluoride phosphor (Intematix's NR6931 KSF). The mixture of phosphors is incorporated in, and homogeneously distributed throughout, a dimethyl-based silicone (Dow Corning OE-6370 HF optical encapsulant). The proportion of KSF of the total phosphor weight is 82% wt % with the remaining 18 wt % comprising GAL 535 (TABLE 6B).

TABLE 6B

| Device | Yellow to green phosphor (wt %) | KSF phosphor (wt %) | Orange to red phosphor (wt %) | Total phosphor content per 100 g silicone (g) | Total phosphor in device (mg) |
|---|---|---|---|---|---|
| Dev.11 (ref) | 18 | 82 | 0 | 150 | 3.69 |
| Dev.12 | 23.5 | 73.5 | 3 | 110 | 3.44 |
| Dev.13 | 22 | 75 | 3 | 83 | 3.51 |

Device Dev.12 comprises a mixture of three phosphors: (i) a yellow to green-emitting phosphor (Intematix's GAL540 cerium-activated green-emitting LuAG phosphor), (ii) a red-emitting manganese-activated fluoride phosphor (Intematix's NR6931 KSF), and (iii) an orange to red-emitting phosphor (Intematix's XR600 nitride-based phosphor). The mixture of phosphors is incorporated in, and homogeneously distributed throughout, a dimethyl-based silicone (Dow Corning OE-6370 HF optical encapsulant). The proportion red phosphor (XR600+KSF) of the total phosphor weight is 76.5 wt % with the remaining 23.5 wt % comprising GAL540 (TABLE 6B). The proportion of KSF is 73.5 wt % and the proportion of XR600 is 3 wt %. The proportion of orange to red phosphor (XR600) of the total red phosphor content (XR600+KSF) is 3.9 wt %.

Device Dev.13 comprises a mixture of three phosphors: (i) a yellow to green-emitting phosphor (Intematix's GAL540 cerium-activated green-emitting LuAG phosphor), (ii) a red-emitting manganese-activated fluoride phosphor (Intematix's NR6931 KSF), and (iii) an orange to red-emitting phosphor (Intematix's XR600 nitride-based phosphor). The mixture of phosphors is incorporated in, and homogeneously distributed throughout, a phenyl-based silicone (Dow Corning OE-6636 optical encapsulant). The proportion of red phosphor (XR600+KSF) of the total phosphor weight is 78 wt % with the remaining 22 wt % comprising GAL540 (TABLE 6B). The proportion of KSF is 75 wt % and the proportion of XR600 is 3 wt %. The proportion of orange to red phosphor (XR600) of the total red phosphor content (XR600+KSF) is 3.8 wt %.

Figure 6:
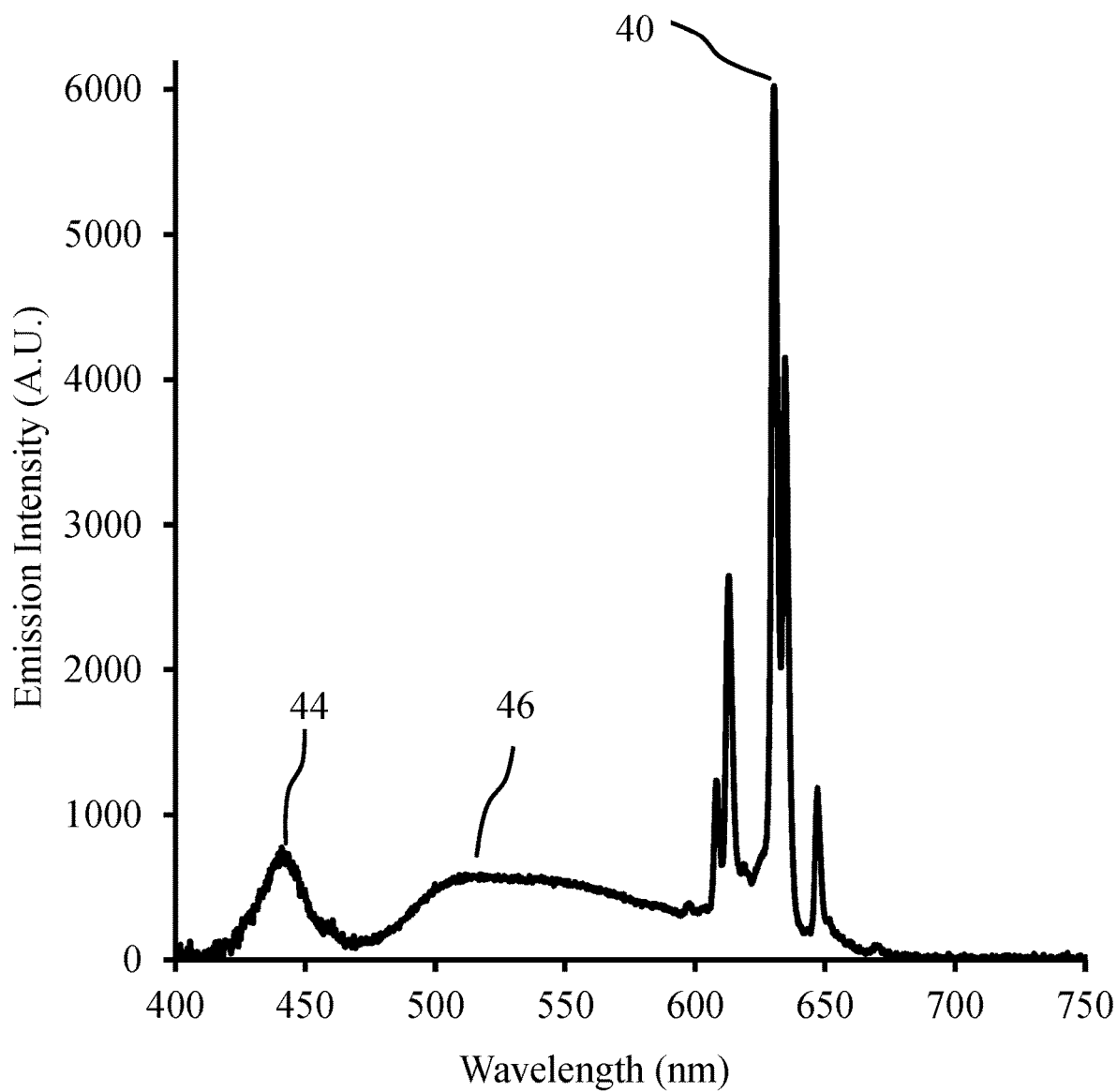
FIG. 6 is an emission spectrum, intensity (a.u.) versus wavelength (nm), for an LED-based white light emitting device (Dev.11) in accordance with an embodiment of the invention.
Figure 7:
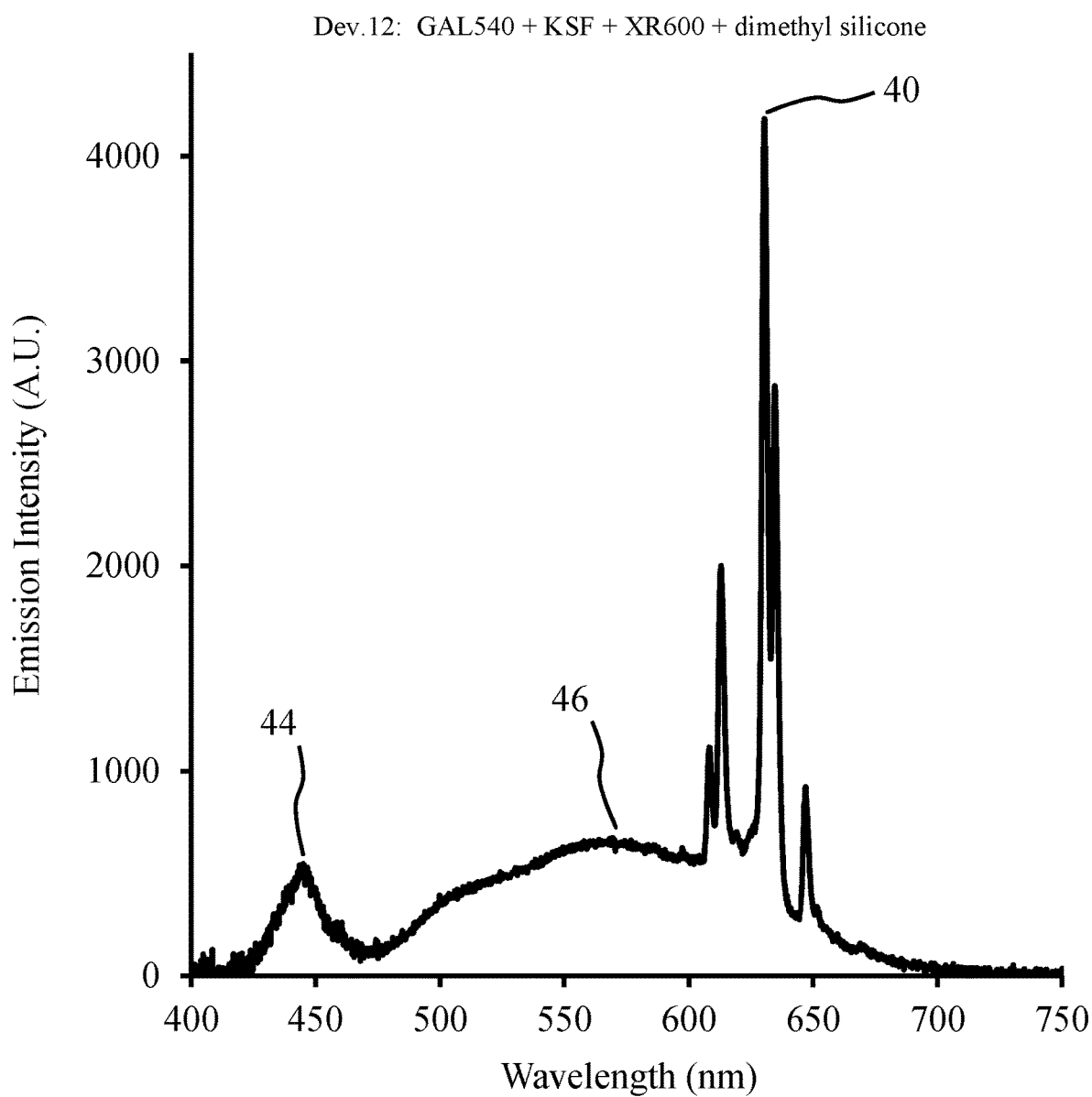
FIG. 7 is an emission spectrum, intensity (a.u.) versus wavelength (nm), for an LED-based white light emitting device (Dev.12) in accordance with an embodiment of the invention.
Figure 8:
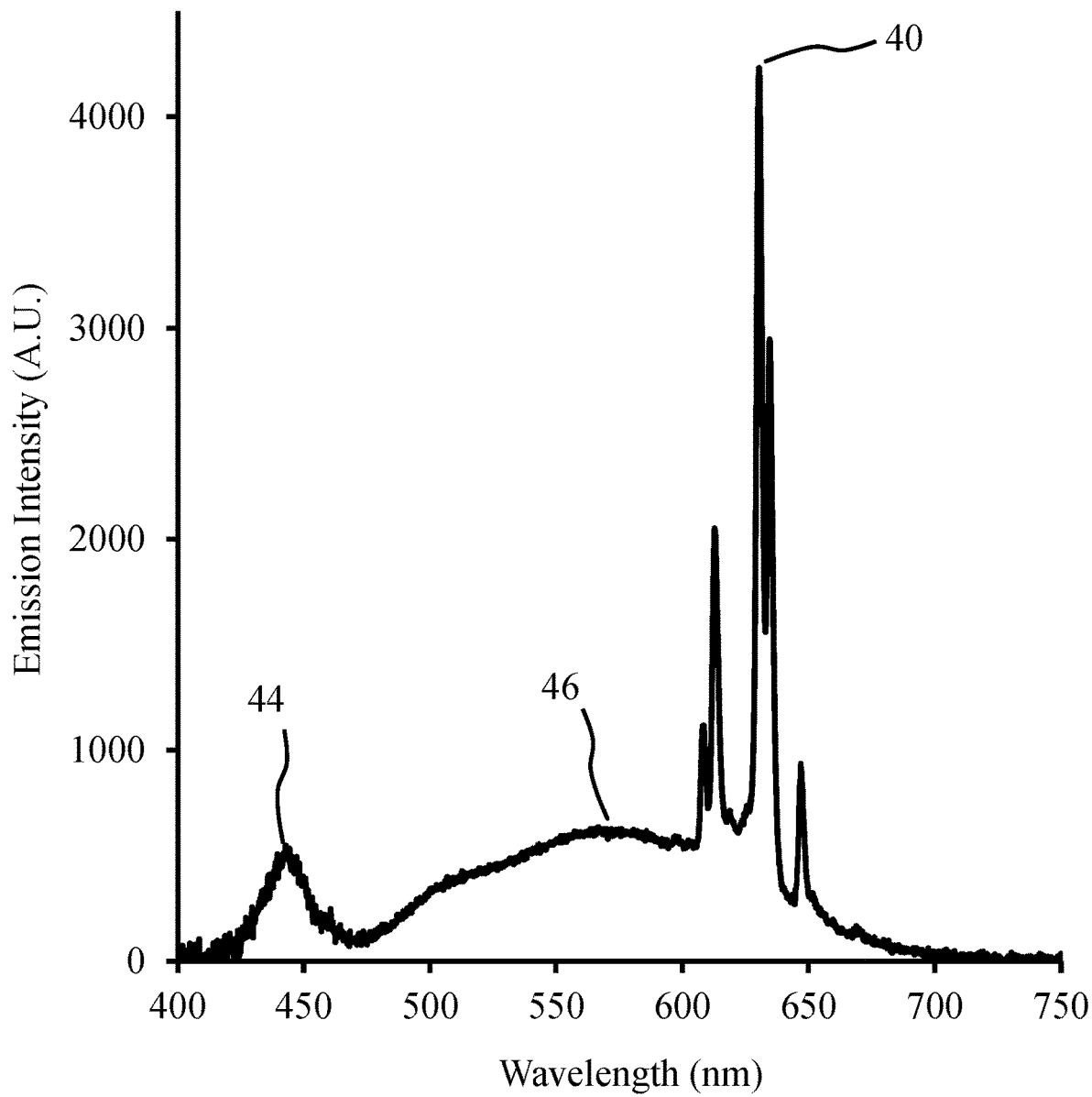
FIG. 8 is an emission spectrum, intensity (a.u.) versus wavelength (nm), for an LED-based white light emitting device (Dev.13) in accordance with an embodiment of the invention.

TABLE 6C tabulates the optical characteristics of the devices Dev.11 (ref), Dev.12 and Dev.13 and FIGS. 6, 7 and 8 respectively show the emission spectra, intensity (a.u.) versus wavelength (nm), for the Dev.11 (ref), Dev.12 and Dev.13.

The benefits of including a third phosphor (i.e. broadband orange to red-emitting phosphor) in addition to the yellow to green-emitting and KSF phosphors is evidenced by comparing the optical characteristics of devices Dev.11 (ref) and Dev.12 (TABLE 6C). It can be seen that the inclusion of a third orange to red-emitting phosphor gives a brightness increase of ≈9%, an increase of General CRI Ra from ≈69 to ≈95, an increase of CRI R9 from ≈7 to ≈93, and an increase in luminous efficacy (LE) from ≈300 to ≈330 lm/W$_{opt}$ (about a 10% increase in LE). In summary the benefits of including a third phosphor (i.e. orange to red-emitting phosphor) can be an increase in brightness, an increase in General CRI Ra, an increase in CRI R9, and an increase in LE.

Referring to FIGS. 6, 7 and 8 these figures visually illustrate the effect of the inclusion of a broadband orange to red-emitting phosphor (XR600). As can be seen from the FIG. 6 the spectrum of Dev.11 is composed of a peak 44 corresponding to blue excitation light from the LED; a broad emission peak 46 with a peak emission wavelength of about 530 nm attributable to emissions of the yellow to green phosphor; and multiple peaks (main peak 40 and satellite peaks) in the red region of the spectrum attributable to the KSF. FIG. 7 shows the spectrum of Dev.12 is composed of a peak 44 corresponding to blue excitation light from the LED; a broad emission peak 46 with a peak emission wavelength of about 570 nm attributable to the combined emissions of the yellow to green phosphor and orange to red phosphor; and multiple peaks (main peak 40 and satellite peaks) in the red region of the spectrum attributable to the KSF. Similarly, as can be seen from the FIG. 8, the spectrum of Dev.13 is composed of a peak 44 corresponding to blue excitation light from the LED; a broad emission peak 46 with a peak emission wavelength of about 575 nm attributable to the combined emissions of the yellow to green phosphor and orange to red phosphor; and multiple peaks (main peak 40 and satellite peaks) in the red region of the spectrum attributable to the KSF. Comparing the emission spectra of FIGS. 7 and 8 with FIG. 6 it will be noted that the inclusion of the orange to red phosphor (i) increases the intensity of light (energy content) of the spectrum for wavelengths from 560 nm to 600 nm and (ii) increases the peak emission wavelength of the broad emission peak 46 from about 530 nm (Dev.11—no XR600) to about 570/575 nm (Devs.12 and 13). It is to be noted that these effect are independent of the encapsulant material (i.e. dimethyl or phenyl silicone).

TABLE 6C

| Device | Luminous Flux (lm) | Brightness (%) | CIE x | CIE y | CCT (K) | CRI Ra | CRI R9 | LE (lm/W$_{opt}$) |
|---|---|---|---|---|---|---|---|---|
| 11 (ref) | 40.21 | 100.0% | 0.4162 | 0.3668 | 3057 | 69.3 | 6.8 | 298 |
| 12 | 43.71 | 108.7% | 0.4382 | 0.3999 | 2947 | 94.8 | 92.8 | 334 |
| 13 | 42.30 | 105.2% | 0.4414 | 0.3925 | 2833 | 94.0 | 95.5 | 328 |

The benefits of encapsulating the three phosphor mixture in a dimethyl silicone (more particularly a light transmissive material with an index of refraction n≈1.40 to 1.43) compared with encapsulating the three phosphor mixture in a phenyl silicone can be determined by comparing the optical characteristics of devices Dev.12 with Dev.13 (TABLE 6C). It can be seen that use of a dimethyl silicone increases the brightness by ≈2.5% (i.e. 105.2% to 108.7%) and increases CRI Ra by ≈1 (i.e. 94.0 to 94.8). The use of a dimethyl silicone, which as described above is believed increases light extraction of light generated by KSF phosphor, which may account for the increase in CRI Ra and luminous efficacy (LE) from 328 lm/W$_{opt}$ (Dev.13) to 334 lm/W$_{opt}$ (Dev.12). It is to be further noted that using a dimethyl silicone not only improves device performance it also reduces overall phosphor usage (3.44 g—Dev.12 versus 3.51 g—Dev.13).

Devices Dev.14 (Ref) and Dev.15: CCT 2700 K White Light Emitting Devices

To further illustrate and explain the benefits of using a three phosphor solution and a phosphor encapsulant having an index of refraction n=1.40 to 1.43, two further devices, Dev.14 (ref) and Dev.15 are now discussed. TABLES 7A and 7B tabulate details of the white light emitting devices, Dev.14 (ref) and Dev.15. Each Device is configured to generate warm white light with a CCT of 2700 K and comprises a SMD 5630 LED package that contains a single 451 nm GaN LED chip.

TABLE 7A

| Device | Yellow to green-emitting phosphor (Wavelength $\lambda_p$) | KSF phosphor (Wavelength $\lambda_p$) | Orange to red-emitting phosphor (Wavelength $\lambda_p$) | Encapsulant |
|---|---|---|---|---|
| Dev.14 (ref) | GAL535 (535 nm) | NR6931 KSF (632 nm) | — | OE-6370 HF Dimethyl |
| Dev.15 | GAL540 (540 nm) | NR6931 KSF (632 nm) | XR600 (600 nm) | OE-6336 Phenyl |

Device Dev.14 (ref) comprises a mixture of two phosphors: (i) a yellow to green-emitting phosphor (Intematix's GAL535 cerium-activated green-emitting LuAG phosphor) and (ii) a red-emitting manganese-activated fluoride phosphor (Intematix's NR6931 KSF). The mixture of phosphors is incorporated in, and homogeneously distributed throughout, a phenyl-based silicone (Dow Corning OE-6336 optical encapsulant). The proportion of KSF of the total phosphor weight is 82% wt % with the remaining 18 wt % comprising GAL 535 (TABLE 7B).

TABLE 7B

| Device | Yellow to green-emitting phosphor (wt %) | KSF phosphor (wt %) | Orange to red-emitting phosphor (wt %) | Total phosphor content per 100 g silicone (g) |
|---|---|---|---|---|
| Dev.14 (ref) | 18 | 82 | 0 | 140 |
| Dev.15 | 23.5 | 73.5 | 3 | 110 |

Device Dev.15 comprises a mixture of three phosphors: (i) a yellow to green-emitting phosphor (Intematix's GAL540 cerium-activated green-emitting LuAG phosphor), (ii) a red-emitting manganese-activated fluoride phosphor (Intematix's NR6931 KSF), and (iii) an orange to red-emitting phosphor (Intematix's XR600 nitride-based phosphor). The mixture of phosphors is incorporated in, and homogeneously distributed throughout, a dimethyl-based silicone (Dow Corning OE-6370 HF optical encapsulant). The proportion of red phosphor (XR600+KSF) of the total phosphor weight is 76.5 wt % with the remaining 23.5 wt % comprising GAL540 (TABLE 7B). The proportion of KSF is 73.5 wt % and the proportion of XR600 is 3 wt %. The proportion of orange to red phosphor (XR600) of the total red phosphor content (XR600+KSF) is 3.9 wt %.

TABLE 7C tabulates the optical characteristics of the Devices 14 (ref) and 15. It can be seen that the combined effect of including a third orange to red-emitting phosphor and the use of a dimethyl silicone encapsulant gives a brightness increase of ≈12%, an increase in the general CRI Ra from ≈70 to ≈95, an increase in CRI R9 from ≈17 to ≈90 and an increase in the luminous efficacy (LE) from ≈311 lm/W$_{opt}$ to ≈333 lm/W$_{opt}$.

TABLE 7C

| Device | Luminous Flux (lm) | Brightness (%) | CIE x | CIE y | CCT (K) | CRI Ra | CRI R9 | LE (lm/W$_{opt}$) |
|---|---|---|---|---|---|---|---|---|
| 14 (ref) | 77 | 100.0% | 0.4579 | 0.4070 | 2699 | 70.3 | 17.3 | 311 |
| 15 | 87 | 112.0% | 0.4598 | 0.4107 | 2701 | 95.8 | 89.5 | 333 |

Figure 9:
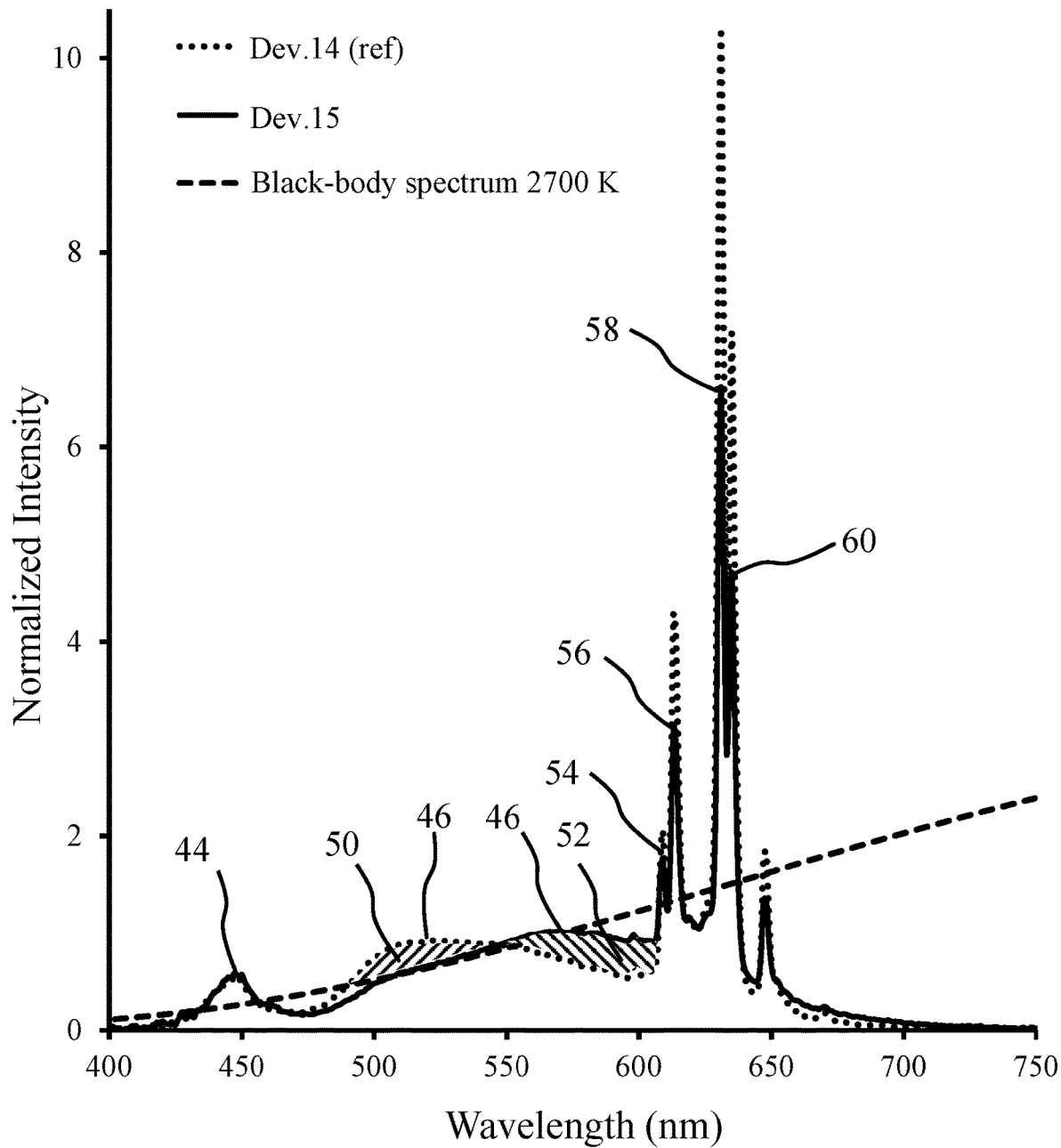
FIG. 9 emission spectra, normalized intensity (normalized to a CIE 1931 XYZ relative luminance Y=100) versus wavelength (nm), for (i) Dev.14(ref) (dotted line), (i) Dev.15 (solid line) and (i) Planckian locus (dashed line) for a CCT of 2700 K.

FIG. 9 shows the normalized intensity versus wavelength (nm) for (i) device Dev.14 (ref) (dotted line), (ii) device Dev.15 (solid line) and (iii) black-body (dashed line) for a CCT of 2700 K. To make a meaningful comparison of the spectra, each of the spectra has been normalized such each has a CIE 1931 XYZ relative luminance Y=100. The data are normalized using the CIE 1931 luminosity function y(λ) of a standard observer which takes account of the photopic response of an observer.

The Planckian spectrum or black-body spectrum (dashed line—FIG. 9) represents the spectrum for a General CRI Ra equal to 100. Accordingly, for a white light emitting device to have the highest color rendering possible, its emission spectrum should match the black-body spectrum as closely as possible. As can be seen from the FIG. 9: the spectrum of Dev.14 (ref) is composed of a peak 44 corresponding to blue excitation light from the LED; a broad emission peak 46 with a peak emission wavelength of about 530 nm attributable to emissions of the yellow to green phosphor; and multiple peaks in the red region of the spectrum attributable to the KSF while the spectrum of Dev.15 is composed of a peak 44 corresponding to blue excitation light from the LED; a broad emission peak 46 with a peak emission wavelength of about 570 nm attributable to the combined emissions of the yellow to green phosphor and orange to red phosphor; and multiple peaks in the red region of the spectrum attributable to the KSF. Comparing the emission spectra it will be noted that the inclusion of the orange to red phosphor (i) increases the intensity of light (energy content) of the spectrum for wavelengths from 560 nm to 600 nm and (ii) increases the peak emission wavelength of the broad emission peak 46 from about 530 nm to about 570 nm.

Referring to FIG. 9 it can be seen that the addition of an orange to red-emitting phosphor and use of encapsulant having an index of refraction that closely matches the index of refraction of the KSF phosphor results in an emission spectrum (solid line) that more closely matches the black-body spectrum (dotted line) in three respects.

First, as indicated by cross hatched area 50, the green peak between about 500 nm and about 540 nm is reduced such that the emission spectrum (solid line) in this region more closely follows the black-body spectrum (dotted line). It is postulated that the reduction of the green peak results from the dimethyl silicone which increases light scattering and reduces light extraction from the yellow to green-emitting phosphor.

Second, as indicated by cross hatched area 52, the valley between about 550 nm and about 610 nm has been filled by the inclusion of the orange to red-emitting phosphor such that the emission spectrum (solid line) in this region more closely follows the black-body spectrum (dotted line).

Third, it is postulated that the combined effects of including an orange to red-emitting phosphor and use of a dimethyl silicone, reduces the total amount of KSF phosphor which reduces the KSF emission spikes 54, 56, 58, 60 (Dev.14 (ref)—115g KSF per 100g of silicone, Dev.15—81g KSF per 100g silicone) such that the emission spectrum (solid line) in this region more closely follows the black-body spectrum (dotted line).

Figure 10:
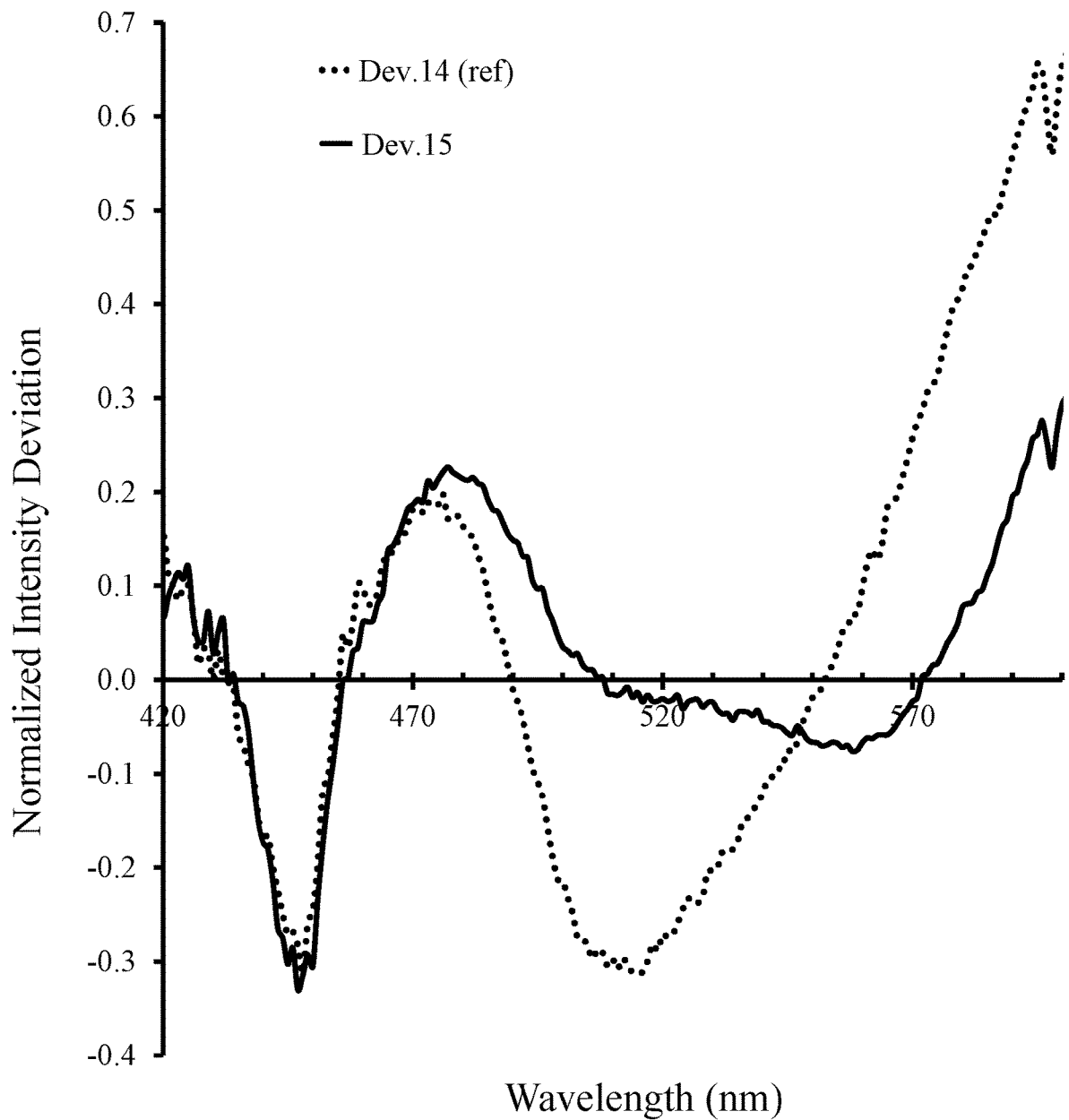
FIG. 10 normalized intensity deviation (normalized for a CIE 1931 XYZ relative Luminance Y=100) from the blackbody spectrum (2700 K) versus wavelength for devices Dev.14 (ref) (dotted line) and Dev.15 (solid line)

FIG. 10 is a plot of normalized intensity deviation (normalized for a CIE 1931 XYZ relative luminance Y=100) from the black-body spectrum (2700 K) versus wavelength for the devices Dev.14 (ref) and Dev.15. As can be seen from the figure over a wavelength range 460 nm to 600 nm a maximum deviation between the intensity of the light emitted by the device normalized to a CIE 1931 XYZ relative luminance Y=100 compared with the intensity of light of a black-body is less than 0.3.

High Luminous Efficacy/High Color Rendering Light Emitting Devices

As described herein light emitting devices comprising a mixture of three phosphors: (i) a yellow to green-emitting phosphor, (ii) a narrowband red-emitting manganese-activated fluoride phosphor, and (iii) a broadband orange to red-emitting phosphor improves luminous efficacy of high color rendering devices and is considered inventive in its own right. Embodiments in accordance with this aspect of the invention are now described.

Cavity Test

The cavity test method involves mixing the phosphor powder mixture with an uncurable optical encapsulant (typically a phenyl silicone) and placing the mixture in a LED cavity containing one or more blue LED dies and measuring total light emission in an integrating sphere. Once the measurement is completed the phosphor/encapsulant mixture is removed and the cavity cleaned ready for the next test.

In this specification, the following nomenclature is used to denote light emitting devices: Com.# denotes a comparative light emitting device comprising one or more yellow to green phosphors and one of a red nitride phosphor (CASN) or a narrowband red photoluminescence material and Dev.# denotes a High luminous efficacy/high color rendering light emitting devices in accordance with an embodiment of the invention comprising a broadband orange to red photoluminescence material, a yellow to green photoluminescence material and a narrowband red photoluminescence material.

2700K to 3000K Light Emitting Devices

TABLE 8 tabulates phosphor compositions for nominal 2700K light emitting devices for a comparative device (2700K, CRI Ra 90), denoted Com.1, comprising a mixture of YAG545/YAG563 and KSF and a light emitting device in accordance with the invention, denoted Dev.16, comprising a mixture of YAG543, CASN615 and KSF.

As can be seen from TABLE 8, in terms of phosphor composition: Com.1 comprises 14.7 wt % YAG545/YAG563+85.3 wt % KSF ($K_2SiF_6:Mn^{4+}$) and Dev.16 comprises 2.1 wt % CASN615 ($Ca_{1-x}Sr_xAlSiN_3$:Eu, $\lambda_{pe}$=615 nm, FWHM ≈74 to 75 nm)+28.1 wt % YAG543 ($\lambda_{pe}$≈543 nm)+69.8 wt % KSF. In Dev.16 the wt % of red phosphor (CASN) out of the total red phosphor content (CASN+KSF) is 2.9 wt %. Each of Com.1 and Dev.1 comprise a PCT2835 (2.8 mm by 3.5 mm) cavity containing three 1133 (0.011" by 0.033") LED dies with a dominant wavelength ($\lambda_d$) of 455 to 460 nm.

TABLE 8

| | 2700K light emitting device phosphor composition | | | | | | |
|---|---|---|---|---|---|---|---|
| | Phosphor composition (wt. %) | | | | | | |
| | Orange to red phosphor | Yellow to Green phosphor | | | Narrowband red phosphor | wt % CASN of total red phosphor | wt % KSF of total red phosphor | Total phosphor per 100 g |
| Device | CASN615 | YAG543 | YAG545 | YAG563 | KSF | | | silicone (g) |
| Com.1 | — | — | 10.3 | 4.4 | 85.3 | 0.0 | 100.0 | 120.4 |
| Dev.16 | 2.1 | 28.1 | — | — | 69.8 | 2.9 | 97.1 | 122.3 |

TABLE 9 tabulates measured phosphor PCT2835 cavity test data for light emitting devices Com.1 and Dev. 16 under test (drive) conditions $I_F$=100 mA, $V_F$≈9.0V (900 mW) and illustrates the effect on optical performance of using a combination of an orange to red phosphor (CASN) and narrowband red phosphor (KSF) compared with using a narrowband red phosphor (KSF) alone. First, it is to be noted that the device (Dev.16) in accordance with the invention comprising a combination of an orange to red phosphor (CASN615) and a narrowband red phosphor (KSF), exhibits a 6.1% increase in Conversion Efficiency (CE) (129.2 lm/W→134.2 lm/W) and a 2.4% increase in Luminous Efficacy (LE) (343.6 lm/$W_{opt}$→351.8 lm/$W_{opt}$) compared with the comparative device (Com.1) that in terms of red photoluminescence material comprises a narrowband red phosphor (KSF) alone. Second, in terms of color rendering, device Dev.16 produces white light with a CRI Ra of 90, a CRI R8 of 83 and a CRI R9 of 55 closely meeting the current standards in lighting, Energy Star (CRI Ra ≥90), California Energy Commission Title 20 code (72 minimum CRI R8) and California Energy Commission Title 24 code (50 minimum CRI R9) with a luminous efficacy of greater than 350 lm/W. In contrast, the comparative device Com.1 produces white light with a CRI Ra of 90, a CRI R8 of 94.5 and a CRI R9 of 86 with a luminous efficacy of about 340 lm/W. While the device Com.1 generates white light with higher CRI R8 and R9 values, these are unnecessarily high compared with the standards and come at the expense of conversion efficiency/luminous efficacy. In contrast it will be appreciated that the device in accordance with the invention not only produces light meeting current standards but also exhibits a significant increase in conversion efficiency/luminous efficacy.

TABLE 9

| | | | | 2700K light emitting device-Measured test data for PCT2835 cavity test | | | | | | | |
|---|---|---|---|---|---|---|---|---|---|---|---|
| | Flux | CE | CE | LE | | | | CCT | | CRI | |
| Device | (lm) | (lm/W) | (%) | (lm/W$_{opt}$) | LE (%) | CIE x | CIE y | (K) | Ra | R8 | R9 |
| Com.1 | 116.8 | 129.2 | 100.0 | 343.6 | 100.0 | 0.4512 | 0.4196 | 2996 | 89.8 | 94.5 | 86.0 |
| Dev.16 | 124.0 | 134.2 | 106.1 | 351.8 | 102.4 | 0.4528 | 0.4232 | 2900 | 90.3 | 83.1 | 54.5 |

TABLE 10 tabulates phosphor compositions for nominal 2700K light emitting devices for light emitting device in accordance with the invention, denoted Dev.17 to Dev.19, comprising a mixture of YAG543, CASN615 and KSF with different relative proportions of KSF to CASN615.

More particularly, as can be seen from TABLE 10, in terms of phosphor composition: Dev.17 comprises 1.5 wt % CASN615+23.9 wt % YAG543+74.6 wt % KSF; Dev.18 comprises 2.1 wt % CASN615+28.2 wt % YAG543+69.7 wt % KSF; and Dev.19 comprises 3.1 wt % CASN615+34.4 wt % YAG543+62.5 wt % KSF. Each of Dev.17 to Dev.19 comprises a PCT2835 (2.8 mm by 3.5 mm) cavity containing three 1133 (0.011" by 0.033") LED dies with a dominant wavelength ($\lambda_d$) of 455 nm to 460 nm.

decrease CRI R9 (83.7→35.0). The data indicates that a device having between 2.9 wt % (Dev.3) and 4.7 wt % (Dev.4) orange to red phosphor (CASN) out of the total red phosphor content will produce white light that most closely meet the current standards of CRI Ra of about 90, a CRI R8 of about 72 and a CRI R9 of about 50 and have a conversion efficiency of between about 106.5% and 108.8% and a luminous efficacy of between 102.3% and 103.9%. From the data presented in TABLE 11, it will be appreciated that Dev.17 generates white light that exhibits color rendering that most closely matches the current standards for CRI Ra,

TABLE 10

| | 2700K light emitting device phosphor composition | | | | | |
|---|---|---|---|---|---|---|
| | Phosphor composition (wt. %) | | | | | |
| Device | Orange to red phosphor CASN615 | Yellow to Green phosphor YAG543 | Narrowband red phosphor KSF | wt % CASN of total red phosphor | wt % KSF of total red phosphor | Total phosphor per 100 g silicone (g) |
| Dev.17 | 1.5 | 23.9 | 74.6 | 2.0 | 98.0 | 129.9 |
| Dev.18 | 2.1 | 28.2 | 69.7 | 2.9 | 97.1 | 128.7 |
| Dev.19 | 3.1 | 34.4 | 62.5 | 4.7 | 95.3 | 134.2 |

TABLE 11 tabulates measured PCT2835 cavity test data for light emitting devices Com.1 and Dev.17 to Dev.19 under test (drive) conditions $I_F$=100 mA, $V_F$≈9.0V (900 mW) and illustrates the effect on optical performance of the proportion (wt %) of orange to red phosphor (CASN615) out of the total red phosphor content (i.e. CASN615+KSF).

Referring to TABLE 11, it is noted that the devices in accordance with the invention comprising a mixture of an orange to red phosphor (CASN615) and narrowband red phosphor (KSF) exhibit an increase in Conversion Efficiency (CE) of between 2.5% and 8.8% compared with the comparative device Com.1 that comprises KSF phosphor alone. In terms of color rendering, it can be seen that by increasing the relative amount of orange to red phosphor (CASN615) this results in a decrease in CRI Ra (96.8→86.7), a decrease in CRI R8 (95.8→74.0) and a CRI R8 and CRI R9. In summary, devices in accordance with the invention can be configured to produce white light meeting current standards while maximizing conversion efficiency/luminous efficacy. In particular, a device having about 3.0 wt % orange to red phosphor (CASN) out of the total red phosphor content will produce white light that closely meets the current standards of CRI Ra of about 90, a CRI R8 of about 72 and a CRI R9 of about 50 while maximizing conversion efficiency/luminous efficacy.

TABLE 11

| | | | | 2700K light emitting device-Measured test data for PCT2835 cavity test | | | | | | | |
|---|---|---|---|---|---|---|---|---|---|---|---|
| | Flux | CE | | LE | | | | CCT | | CRI | |
| Device | (lm) | (lm/W) | CE (%) | (lm/W$_{opt}$) | LE (%) | CIE x | CIE y | (K) | Ra | R8 | R9 |
| Com.1 | 116.4 | 129.8 | 100.0 | 343.6 | 100.0 | 0.4512 | 0.4196 | 2996 | 89.8 | 94.5 | 86.0 |
| Dev.17 | 119.8 | 131.6 | 102.5 | 343.3 | 99.9 | 0.4530 | 0.4180 | 2868 | 96.8 | 95.8 | 83.7 |
| Dev.18 | 124.5 | 135.3 | 106.5 | 351.8 | 102.3 | 0.4495 | 0.4237 | 2953 | 91.5 | 85.3 | 58.9 |
| Dev.19 | 127.1 | 138.2 | 108.8 | 356.9 | 103.9 | 0.4500 | 0.4250 | 2956 | 86.7 | 74.0 | 35.0 |

Figure 11:
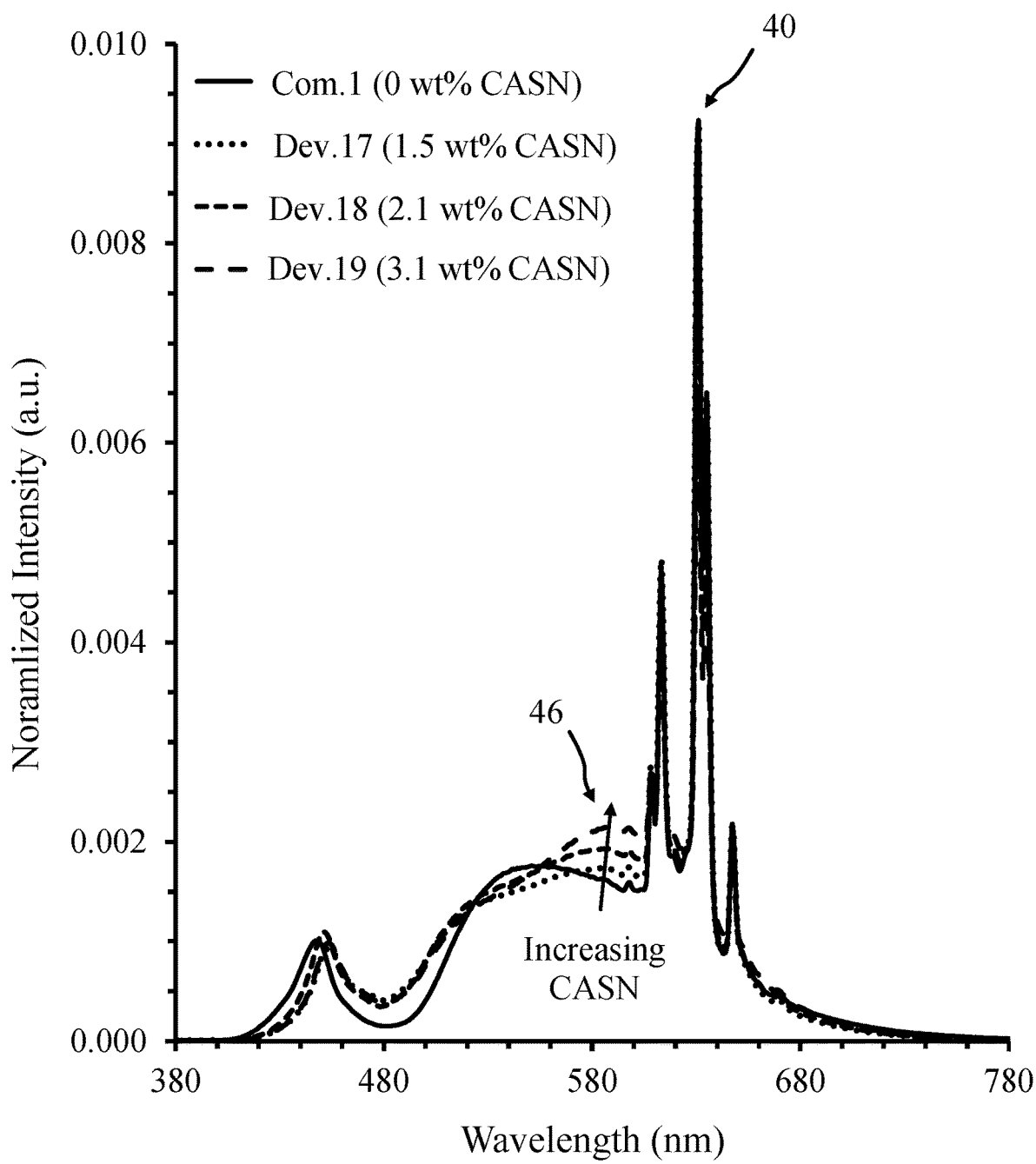
FIG. 11 shows measured emission spectra, normalized intensity (a.u.) versus wavelength (nm), for light emitting devices Com. 1 and Dev.17-19.

FIG. 11 shows measured emission spectra, normalized intensity (a.u.) versus wavelength (nm), for light emitting devices Com. 1 and Dev.17-19 and indicate the visual effect on spectrum of varying the proportion of orange to red phosphor (CASN) out of the total red phosphor content (CASN+KSF). N.B. the wt % CASN numbers in FIG. 11 are wt % of CASN of total phosphor content (i.e. including yellow to green phosphor content) rather that the wt % of CASN of total red phosphor content.

Comparing the emission spectra, it can be seen that increasing the wt % of the orange to red phosphor out of total red phosphor content has two effects:

(i) it increases the intensity of light (energy content) of the spectrum for wavelengths from 560 nm and 600 nm for wavelengths between the broadband peak (about 550 nm— Com.1) attributable to YAG and the longer wavelength narrowband peak (about 600 nm) attributable to KSF as indicated by call-out 46 in FIG. 11 and (ii) it increases the peak emission wavelength of the broad emission peak 46 from about 550 nm (Com.1—no CASN) to about 580 nm to about 587 nm (about 585 nm)— depending on wt % CASN. Additionally, it is to be noted that the ratio of the peak emission intensity of the broad peak (resulting from a combination of the yellow to green phosphor and orange to red phosphor (CASN)) to the peak emission intensity of the main narrowband peak 40 (resulting from the narrowband red phosphor (KSF)) are about 19% (Dev.17), 25% (Dev.18), and 33% (Dev.19).

As can be seen from TABLES 10 and 11, increasing the intensity between the emission peaks (i.e. filling the valley between the emission peaks) and shifting the peak emission wavelength of the broad emission peak 46 to longer wavelengths by increasing the wt % CASN has the effect of decreasing CRI Ra due to a lowering of spectral content in the green region of the visible spectrum and increasing luminous efficacy (LE). It will be noted from TABLES 10 and 11 that for a device which generates white light with a color temperature from about 2700K to about 3000K and a CRI of at least 90, LE is from 353.5 lm/$W_{opt}$ (about 355 lm/$W_{opt}$) to 343.3 lm/$W_{op}$ (about 345 lm/$W_{opt}$) and corresponds to about 3 wt % to about 4 wt % CASN.

Variation of LE and CRI Ra with Wt % Orange to Red Phosphor

TABLE 12 tabulates measured 5630 (5.6 mm by 3.0 mm) cavity test data for light emitting devices with varying wt % proportions of orange to red phosphor (CASN615) out of total red phosphor content (i.e. CASN615+KSF).

TABLE 12

2700K light emitting device-Measured test data for 5630 cavity test

| wt % CASN of total red phosphor content | CIE x | CIE y | CCT (K) | LE (lm/$W_{opt}$) | CRI Ra | R9 |
|---|---|---|---|---|---|---|
| 0 | 0.4585 | 0.4141 | 2746 | 328.6 | 82.5 | 54.2 |
| 1.5 | 0.4580 | 0.4145 | 2756 | 334.5 | 93.2 | 97.6 |
| 3.0 | 0.4584 | 0.4144 | 2750 | 337.9 | 93.1 | 74.1 |
| 4.0 | 0.4585 | 0.4140 | 2745 | 338.5 | 91.5 | 63.9 |
| 5.0 | 0.4583 | 0.4152 | 2758 | 345.1 | 90.3 | 58.3 |
| 6.0 | 0.4583 | 0.4144 | 2751 | 344.2 | 86.8 | 39.8 |
| 100.0 (no KSF) | 0.4584 | 0.4149 | 2753 | 359.5 | 70.0 | −42.7 |

Figure 12:
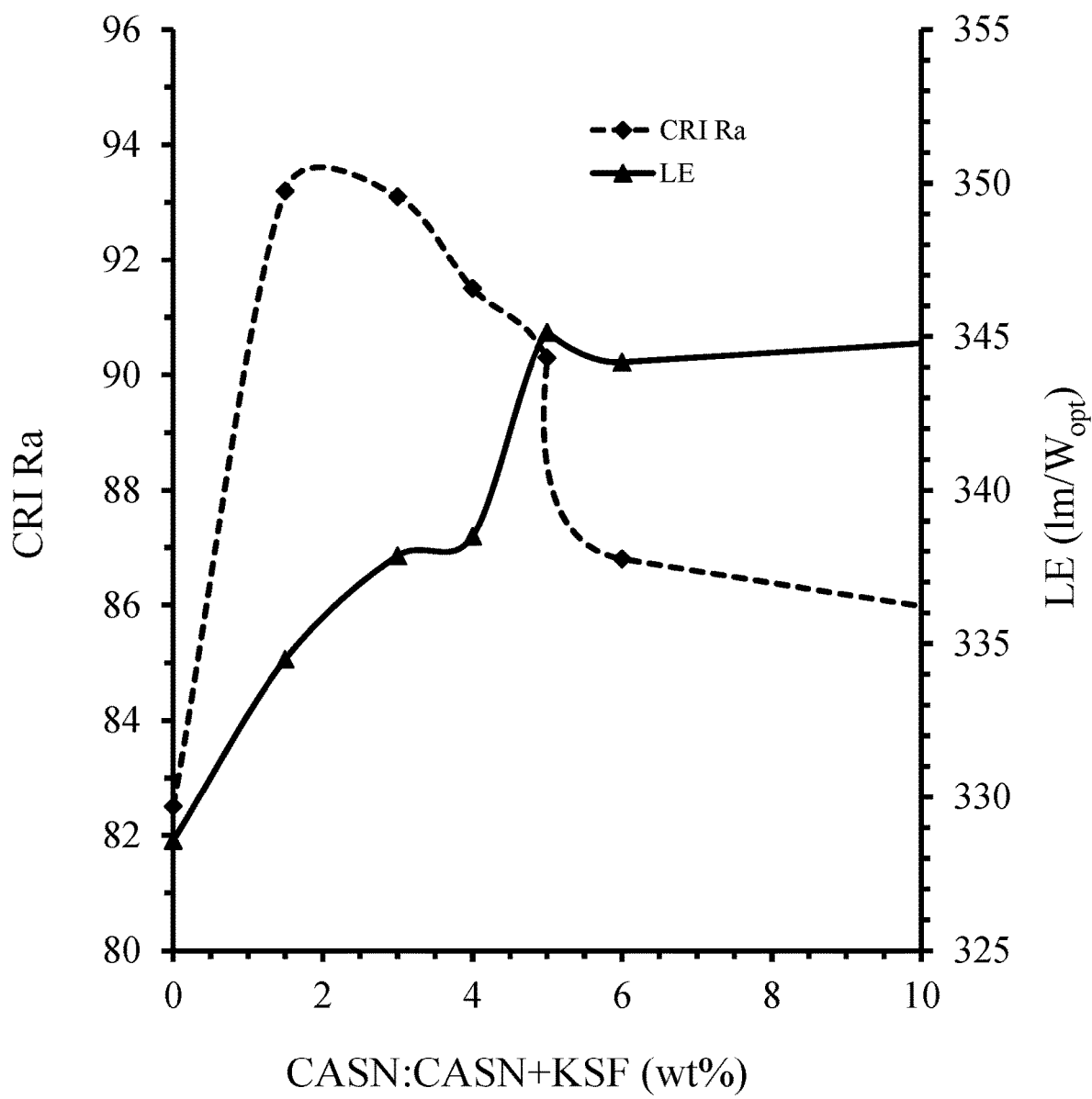
FIG. 12 is a plot of measured general color rendering index CRI Ra and luminous efficacy (lm/W$_{opt}$) versus wt % CASN of total red phosphor content for 2700K light emitting devices.

The effect of wt % orange to red phosphor (CASN) on CRI Ra and LE are illustrated in FIG. 12 which shows the variation of measured CRI Ra and LE (lm/$W_{opt}$) as a function of wt % CASN of total red phosphor content (CASN:CASN+KSF). It can be seen from FIG. 12 that CRI Ra generally rapidly increases for wt % CASN from 0 wt % (i.e. KSF only) to about 1.5 wt % and then rapidly decreases until levelling out at about 5.5 wt %. Conversely, the luminous efficacy (LE) rapidly increases for wt % CASN from 0 wt % (i.e. KSF only) to about 5 wt % and then substantially levels out for 6 wt % and higher. It is to noted that CRI Ra is at least 90 for wt % CASN from about 1 wt % to about 5 wt % while LE is at least 330 lm/$W_{opt}$ (330 lm/$W_{opt}$ to about 346 lm/$W_{opt}$).

As described herein, devices having about 3.0 wt % orange to red phosphor (CASN) out of the total red phosphor content can produce white light that closely meets the current standards of CRI Ra of about 90, a CRI R8 of about 72 and a CRI R9 of about 50 while maximizing conversion efficiency/luminous efficacy (about 355 lm/$W_{opt}$). For such devices the ratio of the peak emission intensity of the broad emission peak to the peak emission intensity of the narrowband peak is about 25%. It is believed that such a spectral characteristic—white light having a first emission peak from about 580 nm to about 587 nm and a second emission peak at about 632 nm, wherein the ratio of the peak emission intensity of the first peak to the peak emission intensity of the second peak is in a range 20% to 30%—results in the superior color rendering (CRI Ra, CRI R8 and CRI R9) of the devices of the invention.

4000K Light Emitting Devices

TABLE 13 tabulates phosphor compositions for nominal 4000K light emitting devices for a comparative device (4000K, CRI Ra 85), denoted Com.2, comprising a mixture of YAG535 and CASN628 and a light emitting device in accordance with the invention, denoted Dev.20, comprising a mixture of YAG535, CASN615 and KSF.

As can be seen from TABLE 13, in terms of phosphor composition: Com.2 comprises 92.9 wt % YAG535 ($\lambda_{pe}$=535 nm)+7.1 wt % CASN628 ($Ca_{1-x}Sr_xAlSiN_3$:Eu, $\lambda_{pe}$=628 nm, FWHM=81 nm) and Dev.20 comprises 1.4 wt % CASN615 ($\lambda_{pe}$=615 nm)+30.5 wt % YAG543 ($\lambda_{pe}$=543 nm)+68.1 wt % KSF. Each of Com.2 and Dev.20 comprises a PPA2835 (2.8 mm by 3.5 mm) cavity containing one 1133 (0.011" by 0.033") LED die with a dominant wavelength ($\lambda_d$) of 454 nm.

TABLE 13

4000K light emitting device phosphor composition

| | Phosphor composition (wt. %) | | | | | |
|---|---|---|---|---|---|---|
| | Orange to red phosphor | | Yellow to Green phosphor | Narrowband red phosphor | wt % CASN of total red phosphor | wt % KSF of total red phosphor | Total phosphor per 100 g silicone (g) |
| Device | CASN615 | CASN628 | YAG535 | KSF | | | |
| Com.2 | — | 7.1 | 92.9 | — | 100.0 | 0.0 | 24.2 |
| Dev.20 | 1.4 | — | 30.5 | 68.1 | 2.0 | 98.0 | 66.7 |

TABLE 14 tabulates measured cavity test data for a PPA2835 cavity for light emitting devices Com.2 and Dev. 5 under test (drive) conditions $I_F$=60 mA, $V_F$≈2.9V (174 mW) and illustrates the effect on optical performance of using a combination of a red phosphor (CASN) and narrowband red phosphor (KSF) compared with using a red phosphor (CASN) alone. First, it is noted that the device (Dev.20) in accordance with the invention comprising a combination of an orange to red phosphor (CASN615) and a narrowband red phosphor (KSF), exhibits a 2.4% increase in Conversion Efficiency (CE) (158.6 lm/W→162.0 lm/W) and a 1.6% increase in Luminous Efficacy (LE) (335.0 lm/W$_{opt}$→340.5 lm/W$_{opt}$) compared with the comparative device (Com.2) that comprises a red phosphor (CASN) alone. Second, in terms of color rendering, device Dev.20 produces white light with a CRI Ra of 93, a CRI R8 of 91.4 and a CRI R9 of 72.4 exceeding the current standards in lighting. In contrast, the comparative device Com.2 produces white light with a CRI Ra of 83.3, a CRI R8 of 65.0 and a CRI R9 of 8.6 and in terms of color rendering fails to meet any of the standards. Moreover, it will be appreciated that the device in accordance with the invention not only produces light meeting current standards but also exhibits an increase in conversion efficiency/luminous efficacy. Referring to TABLES 13 and 14 it can be seen that for a device which generates white light with a color temperature of about 4000K and a CRI of at least 90, LE is 340.5 lm/W$_{opt}$ (about 340 lm/W$_{opt}$) and corresponds to about 2 wt % CASN.

TABLE 14

4000K light emitting device-Measured test data for PPA2835 cavity

| Device | Flux (lm) | CE (lm/W) | CE (%) | LE (lm/W$_{opt}$) | LE (%) | CIE x | CIE y | CCT (K) | Ra | R8 | R9 |
|---|---|---|---|---|---|---|---|---|---|---|---|
| Com.2 | 27.5 | 158.6 | 100.0 | 335.0 | 100.0 | 0.3784 | 0.3844 | 4112 | 83.3 | 65.0 | 8.6 |
| Dev.5 | 28.1 | 162.0 | 102.4 | 340.5 | 101.6 | 0.3723 | 0.3942 | 4334 | 93.0 | 91.4 | 72.4 |

Figure 13:
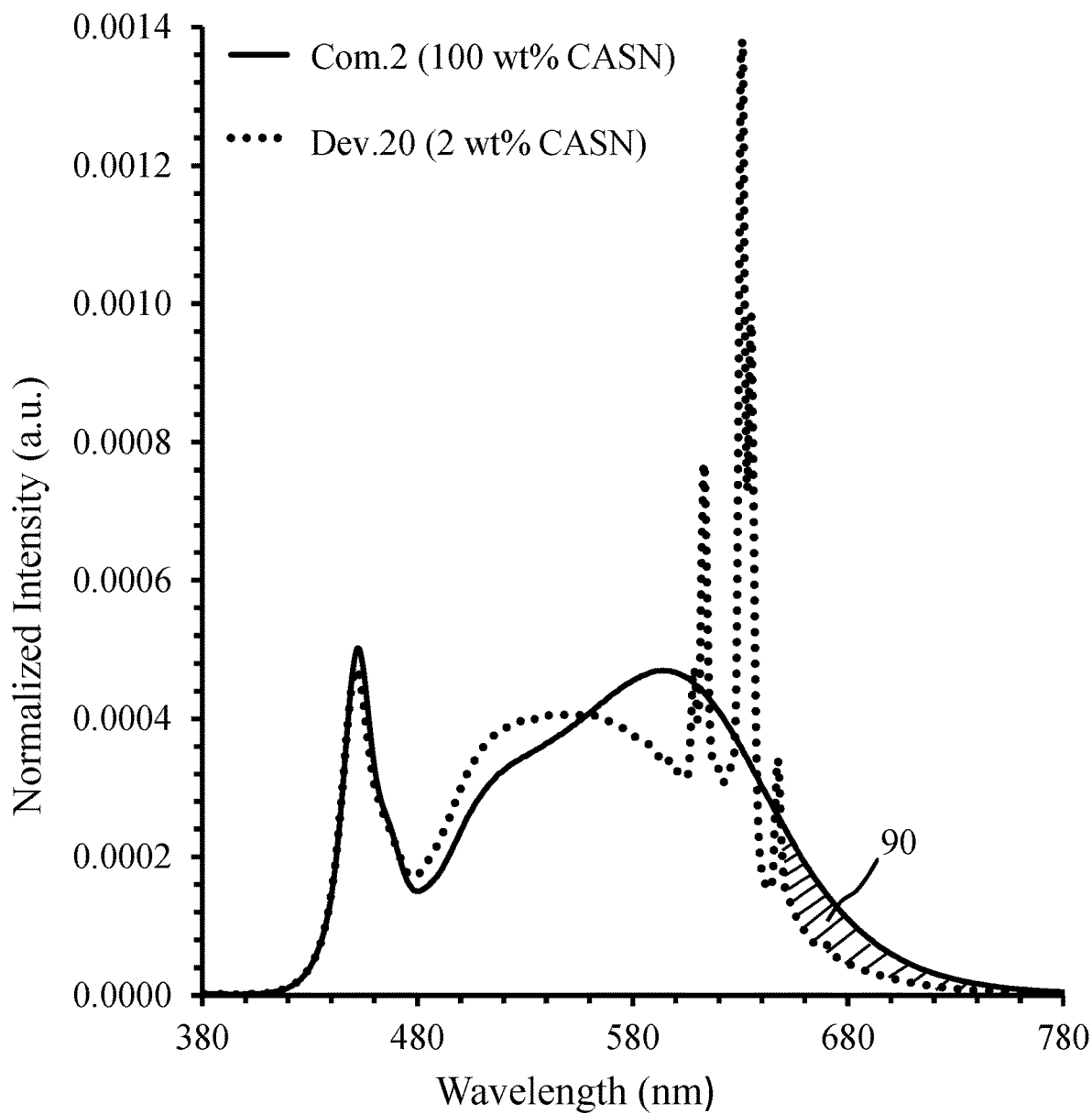
FIG. 13 shows measured emission spectra, intensity versus wavelength, for light emitting devices Com.2 and Dev.20.

FIG. 13 shows measured emission spectra for light emitting devices Com.2 and Dev.20 and indicate the visual effect on spectrum of the inclusion of the narrowband red photoluminescence material (KSF). Comparing the emission spectra, it can be seen that the addition of a narrowband red phosphor (KSF) reduces the energy content of the emission spectrum at wavelength above about 640 nm as indicated by cross-hatched area 90. It is believed that the reduction in energy content for wavelength longer than 640 nm resulting from the inclusion of the narrowband red phosphor (KSF) accounts for the increased luminous efficacy of the devices of the invention.

TABLE 15 tabulates measured test data for a PPA2835 cavity for light emitting devices Com.2 and Dev.20 under test (drive) conditions $I_F$=120 mA, $V_F$≈3.1V (372 mW) and illustrates the effect on optical performance of using a combination of an orange to red phosphor (CASN) and narrowband red phosphor (KSF) compared with using an orange to red phosphor (CASN) alone. First, it is noted that the device (Dev.20) in accordance with the invention comprising a combination of a red phosphor (CASN615) and a narrowband red phosphor (KSF), exhibits a 3.4% increase in Conversion Efficiency (CE) (133.8 lm/W→137.8 lm/W) and a 1.6% increase in Luminous Efficacy (LE) (335.2 lm/W$_{opt}$→340.5 lm/W$_{opt}$) compared with the comparative device (Com.2) that comprises a red phosphor (CASN) alone. Second, in terms of color rendering device Dev.20 produces white light with a CRI Ra of 91.5, a CRI R8 of 89.3 and a CRI R9 of 65.1 exceeding the current standards in lighting. In contrast, the comparative device Com.2 produces white light with a CRI Ra of 82.8, a CRI R8 of 64.8 and a CRI R9 of 6.6 and in terms of color rendering fails to meet any of the standards. Moreover, it will be appreciated that the device in accordance with the invention not only produces light meeting current standards but also exhibits an increase in conversion efficiency/luminous efficacy.

TABLE 15

4000K light emitting device-Measured test data for PPA2835 cavity test ($I_F$ = 120 mA, $V_F$ = 3.1 V)

| Device | Flux (lm) | CE (lm/W) | CE (%) | LE (lm/W$_{opt}$) | LE (%) | CIE x | CIE y | CCT (K) | Ra | R8 | R9 |
|---|---|---|---|---|---|---|---|---|---|---|---|
| Com.2 | 49.9 | 133.8 | 100.0 | 335.2 | 100.0 | 0.3781 | 0.3845 | 4119 | 82.8 | 64.8 | 6.6 |
| Dev.20 | 51.6 | 137.8 | 103.4 | 340.5 | 101.6 | 0.3723 | 0.3942 | 4334 | 91.5 | 89.3 | 65.1 |

5000K Light Emitting Devices

TABLE 16 tabulates phosphor compositions for a nominal 5000K light emitting devices for a light emitting device in accordance with the invention, denoted Dev.21, comprising a mixture of YAG543, CASN615 and KSF.

As can be seen from TABLE 16, in terms of phosphor composition, Dev.21 comprises 0.8 wt % CASN615 ($\lambda_{pe}$=615 nm)+33.3 wt % YAG543 ($\lambda_{pe}$=543 nm)+65.9 wt % KSF. Dev.21 comprises a PCT2835 (2.8 mm by 3.5 mm) cavity containing three 1133 (0.011" by 0.033") LED dies with a dominant wavelength ($\lambda_d$) of 455 nm to 460 nm.

TABLE 16

5000K light emitting device phosphor composition

| | Phosphor composition (wt. %) | | | | |
| --- | --- | --- | --- | --- | --- |
| Device | Orange to red phosphor CASN615 | Yellow to Green phosphor YAG543 | Narrowband red phosphor KSF | wt % CASN of total red phosphor | wt % KSF of total red phosphor | Total phosphor per 100 g silicone (g) |
| Dev.21 | 0.8 | 33.3 | 65.9 | 1.2 | 98.8 | 52.6 |

TABLE 17 tabulates measured test data for a PPA2835 cavity for light emitting devices Com.1 and Dev.21 under test (drive) conditions $I_F$=100 mA, $V_F$=9.13V (913 mW). TABLE 16 also tabulates measured test data for a PPA2835 cavity for light emitting device Com.1 (2700K) under test (drive) conditions $I_F$=100 mA, $V_F$≈9.0V (900 mW)). The measured test data indicates the effect on optical performance of using a combination of a red phosphor (CASN) and narrowband red phosphor (KSF) compared with using a narrowband red phosphor (KSF) alone. First, it is noted that the device (Dev.21) in accordance with the invention comprising a combination of an orange to red phosphor (CASN615) and a narrowband red phosphor (KSF), exhibits a 9.5% increase in Conversion Efficiency (CE) (129.2 lm/W→140.2 lm/W) and a 3.7% decrease (335.2 lm/$W_{opt}$→340.5 lm/$W_{opt}$) in Luminous Efficacy (LE) compared with the comparative device (Com.1) that comprises a narrowband red phosphor (KSF) alone. The decrease in LE can be attributed to the different color temperature (2700K) of the comparative device. Second, in terms of color rendering, device Dev.21 produces white light with a CRI Ra of 92.6, a CRI R8 of 90.9 and a CRI R9 of 72 exceeding the current standards in lighting. Referring to TABLES 16 and 17 it can be seen that for a device which generates white light with a color temperature of about 5000K and a CRI of at least 90, LE is 330.8 lm/$W_{opt}$ (about 330 lm/$W_{opt}$) corresponding to 1.2 wt % CASN (about 1 wt % CASN).

TABLE 17

5000K light emitting device-Measured test data PPA2835 cavity test ($I_F$ = 100 mA, $V_F$ = 9.1 V)

| Device | Flux (lm) | CE (lm/W) | CE (%) | LE (lm/$W_{opt}$) | LE (%) | CIE x | CIE y | CCT (K) | CRI Ra | R8 | R9 |
| --- | --- | --- | --- | --- | --- | --- | --- | --- | --- | --- | --- |
| Com.1 | 116.4 | 129.2 | 100.0 | 343.6 | 100.0 | 0.4512 | 0.4196 | 2996 | 89.8 | 94.5 | 86.0 |
| Dev.21 | 127.9 | 140.2 | 109.5 | 330.8 | 96.3 | 0.3338 | 0.3645 | 5458 | 92.6 | 90.9 | 72.0 |

Maximizing Luminous Efficacy while Meeting CRI Standards

As described above it is possible with light emitting devices in accordance with the invention to not only meet current CRI standards but to also maximize luminous efficacy.

TABLE 18 tabulates phosphor compositions for nominal 2700K PCT 2835 packaged light emitting devices for a comparative device (2700K, CRI Ra 90), denoted Com.3, comprising a mixture of GAL535 and CASN628 and a light emitting device in accordance with the invention, denoted Dev.22, comprising a mixture of YAG543, CASN615 and KSF.

As can be seen from TABLE 18, in terms of phosphor composition: Com.3 comprises 91.7 wt % GAL535 ($Lu_{3-x}(Al_{1-y}Ga_y)_5O_{12}$:$Ce_x$, $\lambda_{pe}$=535 nm)+8.3 wt % CASN628 ($Ca_{1-x}Sr_xAlSiN_3$:Eu, $\lambda_{pe}$=628 nm, FWHM>80 nm) and Dev.7 comprises 2.1 wt % CASN615 ($Ca_{1-x}Sr_xAlSiN_3$:Eu, $\lambda_{pe}$=615 nm, FWHM 74 to 75 nm)+30.0 wt % YAG543 ($\lambda_{pe}$=543 nm)+67.9 wt % KSF. In Dev.7 the wt % of red phosphor (CASN) out of the total red phosphor content (CASN+KSF) is 3.0 wt %. Each of Com.3 and Dev.22 comprise a PCT2835 (2.8 mm by 3.5 mm) package containing three 1133 (0.011" by 0.033") LED dies with a dominant wavelength ($\lambda_d$) of 451.8 nm.

TABLE 18

2700K PCT 2835 packaged light emitting device phosphor composition

| | Phosphor composition (wt. %) | | | | | | Total |
|---|---|---|---|---|---|---|---|
| | Orange to red phosphor | | Yellow to Green phosphor | | Narrowband red phosphor | wt % CASN of total red | wt % KSF of total red | phosphor per 100 g |
| Device | CASN615 | CASN628 | GAL535 | YAG543 | KSF | phosphor | phosphor | silicone (g) |
| Com.3 | — | 8.3 | 91.7 | — | — | 100.0 | 0.0 | 45.0 |
| Dev.22 | 2.1 | — | — | 30.0 | 67.9 | 3.0 | 97.0 | 130.0 |

TABLE 19 tabulates measured PCT2835 packaged test data for light emitting devices Com.3 and Dev. 22 and illustrates the effect on optical performance of using a combination of an orange to red phosphor (CASN) and narrowband red phosphor (KSF) compared with using a red phosphor (CASN) alone. First, it is to be noted that the device (Dev.22) in accordance with the invention comprising a combination of an orange to red phosphor (CASN615) and a narrowband red phosphor (KSF), exhibits a 5.2% increase in Conversion Efficiency (CE) (245.4 lm/W→258.0 lm/W) and a 6.1% increase in Luminous Efficacy (LE) (330.1 lm/W$_{opt}$→350.1 lm/W$_{opt}$) compared with the comparative device (Com.3) that in terms of red photoluminescence material comprises a red phosphor (CASN) alone. Second, in terms of color rendering, device Dev.22 produces white light with a CRI Ra of 90.0, a CRI R8 of 86.2 and a CRI R9 of 60.0 closely meeting the current standards in lighting, Energy Star (CRI Ra ≥90), California Energy Commission Title 20 code (72 minimum CRI R8) and California Energy Commission Title 24 code (50 minimum CRI R9) with a luminous efficacy of greater than 350 lm/W. In contrast, the comparative device Com.3 produces white light with a CRI Ra of 80.7, a CRI R8 of 53.0 and a CRI R9 of −2.1 that fails to meet the standards and has a lower a luminous efficacy of only about 330 lm/W. It will be appreciated that the device in accordance with the invention not only produces light meeting current standards but also exhibits a significant increase in conversion efficiency/luminous efficacy.

TABLE 19

2700K PCT 2835 packaged light emitting device-Measured test data (LED $\lambda_d$ = 451.8 nm)

| Device | Flux (lm) | CE (lm/W) | CE (%) | LE (lm/W$_{opt}$) | LE (%) | CIE x | CIE y | CCT (K) | CRI Ra | R8 | R9 |
|---|---|---|---|---|---|---|---|---|---|---|---|
| Com.3 | 108.0 | 245.4 | 100.0 | 330.1 | 100.0 | 0.4562 | 0.4063 | 2718 | 80.7 | 53.0 | −2.1 |
| Dev.22 | 113.6 | 258.0 | 105.2 | 350.1 | 106.1 | 0.4443 | 0.4181 | 2991 | 90.0 | 86.2 | 60.0 |

TABLE 20 tabulates phosphor compositions for nominal 2700K light emitting devices for a comparative device (2700K, CRI Ra 90), denoted Com.4, comprising a mixture of GAL535 and CASN628 and a light emitting device in accordance with the invention, denoted Dev.23, comprising a mixture of GAL540, XR600 and KSF.

As can be seen from TABLE 20, in terms of phosphor composition: Com.4 comprises 92.0 wt % GAL535+8.0 wt % CASN628 (Ca$_{1-x}$Sr$_x$AlSiN$_3$:Eu, $\lambda_{pe}$=628 nm, FWHM>80 nm) and Dev.23 comprises 6.5 wt % XR600 (Ba$_{2-x}$Sr$_x$Si$_5$N$_8$: Eu, $\lambda_{pe}$=600 nm, FWHM≈79 nm)+28.0 wt % GAL540 ($\lambda_{pe}$=540 nm)+65.5 wt % KSF. In Dev.23 the wt % of orange to red phosphor (CASN) out of the total red phosphor content (CASN+KSF) is 9.0 wt %. Each of Com.4 and Dev.23 comprise a 5630 (5.6 mm by 3.0 mm) cavity containing a single LED die with a dominant wavelength ($\lambda_d$) of 452.4 nm.

TABLE 20

2700K light emitting device phosphor composition

| | Phosphor composition (wt.%) | | | | | Total | | |
|---|---|---|---|---|---|---|---|---|
| | Orange to red phosphor | | Yellow to Green phosphor | | Narrowband red phosphor | wt % CASN of total red | wt % KSF of total red | phosphor per 100 g |
| Device | XR600 | CASN628 | GAL535 | GAL540 | KSF | phosphor | phosphor | silicone (g) |
| Com.4 | — | 8.0 | 92.0 | — | — | 100.0 | 0.0 | 60.0 |
| Dev.23 | 6.5 | — | — | 28.0 | 65.5 | 9.0 | 91.0 | 100.0 |

TABLE 21 tabulates measured 5630 cavity test data for light emitting devices Com.4 and Dev. 23 and illustrates the effect on optical performance of using a combination of a red phosphor (XR—258 nitride) and narrowband red phosphor (KSF) compared with using a red phosphor (CASN) alone. First, it is to be noted that the device (Dev.23) in accordance with the invention comprising a combination of a red phosphor (XR600) and a narrowband red phosphor (KSF), exhibits a 2.0% increase in Conversion Efficiency (CE) (243.2 lm/W→248.1 lm/W) and a 4.7% increase in Luminous Efficacy (LE) (331.1 lm/W$_{opt}$→346.5 lm/W$_{opt}$) compared with the comparative device (Com.4) that in terms of red photoluminescence material comprises a red phosphor (CASN) alone. Second, in terms of color rendering, device Dev.23 produces white light with a CRI Ra of 89.0, a CRI R8 of 83.1 and a CRI R9 of 58.7 closely meeting the current standards in lighting, Energy Star (CRI Ra ≥90), California Energy Commission Title 20 code (72 minimum CRI R8) and California Energy Commission Title 24 code (50 minimum CRI R9) with a luminous efficacy of greater than 350 lm/W. In contrast, the comparative device Com.4 produces white light with a CRI Ra of 82.5, a CRI R8 of 55.5 and a CRI R9 of 4.0 that fail to meet the standards and have a lower a luminous efficacy of only about 331 lm/W. It will be appreciated that the device in accordance with the invention not only produces light meeting current standards but also exhibits a significant increase in conversion efficiency/luminous efficacy.

TABLE 21

2700K light emitting device-Measured test data for 5630 cavity (LED $\lambda_d$ = 452.4 nm)

| | Flux | CE | | LE | LE | | | CCT | CRI | | |
|---|---|---|---|---|---|---|---|---|---|---|---|
| Device | (lm) | (lm/W) | CE (%) | (lm/W$_{opt}$) | (%) | CIE x | CIE y | (K) | Ra | R8 | R9 |
| Com.4 | 18.0 | 243.2 | 100.0 | 331.1 | 100.0 | 0.4620 | 0.4145 | 2701 | 82.5 | 55.5 | 4.0 |
| Dev.23 | 18.4 | 248.1 | 102.0 | 346.5 | 104.7 | 0.4622 | 0.4148 | 2700 | 89.0 | 83.1 | 58.7 |

TABLE 22 tabulates phosphor compositions for nominal 2700K light emitting devices for comparative devices (2700K, CRI Ra 90), denoted Com.5 and Com.6, which respectively comprises a mixture of a yellow to green phosphor and CASN and KSF respectively and light emitting devices in accordance with the invention, denoted Dev.24 and Dev.25, comprising a mixture of GAL543, XR600 and KSF.

As can be seen from TABLE 22, in terms of phosphor composition: Com.5 comprises 91.7 wt % GAL535+8.3 wt % CASN628, Com.6 comprises 19.0 wt % YAG558+81.0 wt % KSF, Dev.24 comprises 5.6 wt % XR600+27.0 wt % YAG543+66.4 wt % KSF and Dev.25 comprises 8.9 wt % XR600+26.0 wt % YAG543+65.1 wt % KSF. The wt % of red orange to phosphor (XR600) out of the total red phosphor content (XR600+KSF) is 9.0 wt % in Dev.24 and 12.0 wt % in Dev.25. Each of Com.4, Com.5, Dev.24 and Dev.25 comprise a 2835 (2.8 mm by 3.5 mm) package containing three 1133 (0.011" by 0.033") LED dies with a dominant wavelength ($\lambda_d$) of 453 nm.

TABLE 22

2700K 2835 packaged light emitting device phosphor composition

| | Phosphor composition (wt.%) | | | | | | | Total |
|---|---|---|---|---|---|---|---|---|
| | Orange to red phosphor | | Yellow to Green phosphor | | Narrowband red phosphor | wt % CASN of total red | wt % KSF of total red | phosphor per 100 g |
| Device | XR600 | CASN628 | GAL535 | YAG543 | YAG558 | KSF | phosphor | phosphor | silicone (g) |
| Com.5 | — | 8.3 | 91.7 | — | — | — | 100.0 | 0.0 | 45.0 |
| Com.6 | — | — | — | — | 19.0 | 81.0 | 0.0 | 100.0 | 100.0 |
| Dev.24 | 5.6 | — | — | 27.0 | — | 66.4 | 9.0 | 91.0 | 75.0 |
| Dev.25 | 8.9 | — | — | 26.0 | — | 65.1 | 12.0 | 88.0 | 75.0 |

TABLE 23 tabulates measured 2835 packaged test data for light emitting devices Com.5, Com.6, Dev.24 and Dev.25 and illustrates the effect on optical performance of using a combination of an orange to red phosphor (XR—258 nitride) and narrowband red phosphor (KSF) compared with using a red phosphor (CASN) alone Com.5. First, it is to be noted that devices (Dev.24 and Dev.25) in accordance with the invention comprising a combination of an orange to red phosphor (XR600) and a narrowband red phosphor (KSF), respectively exhibit a 1.5 and 3.8% increase in Conversion Efficiency (CE) and a 2.2% and 2.7% increase in Luminous Efficacy (LE) (330.2 lm/$W_{opt}$→337.4 lm/$W_{opt}$ and 339.1 lm/$W_{opt}$) compared with the comparative device (Com.5) that in terms of red photoluminescence material comprises a red phosphor (CASN) alone. Second, in terms of color rendering, devices Dev.24 and Dev.25 respectively produce white light with a CRI Ra of 92.6 and 88.5, a CRI R8 of 86.2 and 79.2 and a CRI R9 of 66.5 and 50.4 and each closely meets the current standards in lighting, Energy Star (CRI Ra ≥90), California Energy Commission Title 20 code (72 minimum CRI R8) and California Energy Commission Title 24 code (50 minimum CRI R9) with a luminous efficacy of greater than 337 lm/W. In contrast, the comparative device Com.5 produces white light with a CRI Ra of 80.7, a CRI R8 of 52.6 and a CRI R9 of −2.0 that fail to meet the standards and has a lower luminous efficacy of only about 330 lm/W. It will be appreciated that the device in accordance with the invention not only produces light meeting current standards but also exhibits an increase in conversion efficiency/luminous efficacy.

The inventors have discovered that when light emitting devices of the invention are operated at a temperature of 85° C., rather than 25° C., there can be an increase in CRI Ra accompanied by a decrease in luminous efficacy. This indicates that the amount of orange to red phosphor (CASN) should be adjusted for the device to achieve the target CRI Ra while optimizing LE (FIG. 12). It is believed that this results from the quantum efficiency (QE) of narrowband red phosphors, such as manganese-activated fluoride phosphors KSF, KGF and KTF, decreasing less rapidly with temperature than does the QE of the orange to red and yellow to green phosphors. In particular it is observed that there is only a small decrease in QE for KSF, KGF and KTF for operating temperatures from 25° C. to 85° C. It is believed that the increase in CRI Ra and decrease in luminous efficacy results from there being a lower than expected contribution from the orange to red light to the spectrum relative to the contribution of the KSF at higher temperatures.

Variation of LE and Peak Emission Intensity and Wavelength of Broad Emission Peak with Color Temperature TABLE 24 tabulates wt % of orange to red phosphor (wt % CASN) of total red phosphor (i.e. CASN+KSF) for CRI Ra 90 light emitting devices with nominal color temperatures 2200K (Dev.26), 2700K (Dev.27), 3000K (Dev.28), 4000K (Dev.29), 5000K (Dev.30), and 6500K (Dev.31).

TABLE 24

2200K to 6500K 2835 packaged light emitting device orange to red phosphor composition-Devs.26-31

| Device | Nominal CCT (K) | wt % CASN615 of total red phosphor |
|---|---|---|
| Dev.26 | 2200 | 8.0 |
| Dev.27 | 2700 | 3.5 |
| Dev.28 | 3000 | 3.4 |
| Dev.29 | 4000 | 3.8 |

TABLE 23

2700K 2835 packaged light emitting device-Measured test data (LED $\lambda_d$ = 453.0 nm)

| | Flux | | LE | LE | | | CCT | CRI | | |
|---|---|---|---|---|---|---|---|---|---|---|
| Device | (lm) | CE (%) | (lm/$W_{opt}$) | (%) | CIE x | CIE y | (K) | Ra | R8 | R9 |
| Com.5 | 106.6 | 100.0 | 330.2 | 100.0 | 0.4593 | 0.4079 | 2687 | 80.7 | 52.6 | −2.0 |
| Com.6 | 104.3 | 97.8 | 336.4 | 101.9 | 0.4551 | 0.4104 | 2766 | 89.9 | 90.4 | 96.3 |
| Dev.24 | 101.5 | 101.5 | 337.4 | 102.2 | 0.4577 | 0.4098 | 2724 | 92.6 | 86.2 | 66.5 |
| Dev.25 | 103.8 | 103.8 | 339.1 | 102.7 | 0.4546 | 0.4072 | 2749 | 88.5 | 79.2 | 50.4 |

TABLE 24-continued 2200K to 6500K 2835 packaged light emitting device
orange to red phosphor composition-Devs.26-31

| Device | Nominal CCT (K) | wt % CASN615 of total red phosphor |
|---|---|---|
| Dev.30 | 5000 | 2.4 |
| Dev.31 | 6500 | 1.1 |

TABLE 25 tabulates measured 2835 packaged test data for light emitting devices Devs.26 to 31.

TABLE 25

Measured test data for 2200K to 6500K 2835 packaged light emitting devices Devs.26-31
(LED $\lambda_d$ = 453.0 nm)

| | LE | | | CCT | CRI | | Broad emission peak 46 | |
|---|---|---|---|---|---|---|---|---|
| Device | (lm/W$_{opt}$) | CIE x | CIE y | (K) | Ra | R9 | $\lambda_{pe}$ (nm) | Intensity at $\lambda_{pe}$ relative to intensity of KSF main peak |
| Dev.26 | 334.5 | 0.4956 | 0.4146 | 2298 | 92.8 | 52.7 | ≈590 to ≈600 | ≈25% |
| Dev.27 | 344.3 | 0.4609 | 0.4159 | 2727 | 91.2 | 58.5 | ≈590 to ≈600 | ≈25% |
| Dev.28 | 347.9 | 0.4371 | 0.4136 | 3074 | 89.8 | 54.0 | ≈580 to ≈590 | ≈28% |
| Dev.29 | 335.8 | 0.3823 | 0.3850 | 4010 | 92.0 | 62.6 | ≈570 to ≈580 | ≈35% |
| Dev.30 | 328.5 | 0.3510 | 0.3687 | 4849 | 91.0 | 58.0 | ≈550 to ≈570 | ≈42% |
| Dev.31 | 316.0 | 0.3191 | 0.3425 | 6104 | 89.4 | 53.8 | ≈530 to ≈550 | ≈50% |

Figure 14:
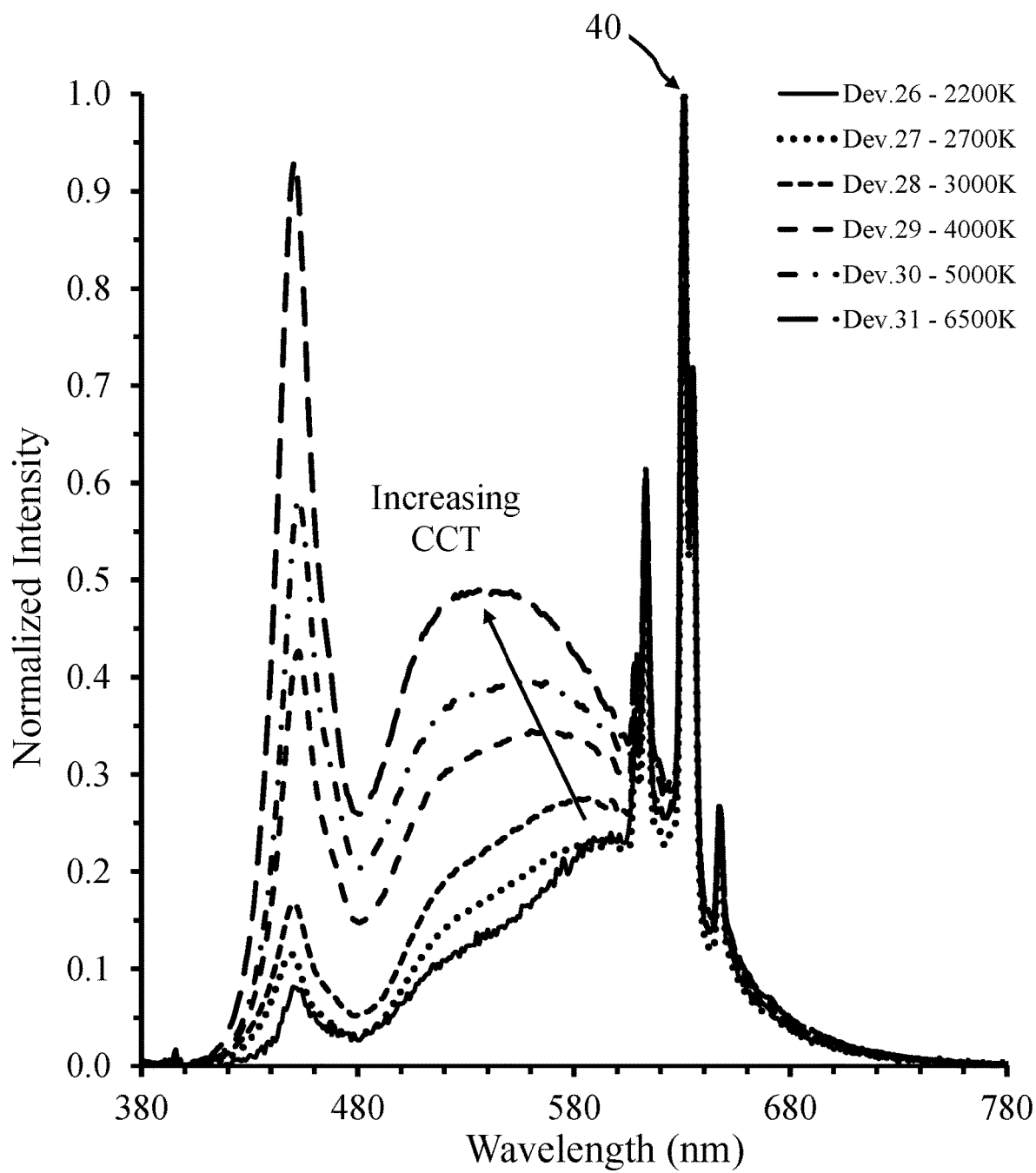
FIG. 14 measured emission spectra, normalized intensity (normalized to the peak emission wavelength of the dominant peak of KSF≈632 nm) versus wavelength (nm) for devices Devs.26-31.

FIG. 14 shows measured emission spectra, normalized intensity versus wavelength (nm), for devices Devs.26-31. The intensity values have been normalized to the peak emission intensity of the main emission peak 40 of the KSF. As can be seen from FIG. 14 and TABLE 25 the peak emission wavelength of the broad emission peak 46 (attributable to the combined emissions of the yellow to green and orange to red phosphors) increases from about 530 nm to about 600 nm for color temperatures from 2200K to 6500K. The peak emission intensity of the broad emission peak 46 relative to the intensity of the main narrowband red (KSF) emission peak increases from about 25% to about 50% over color temperatures from 2200K to 6500K. More particularly, for a color temperature of about 2200K to 2700K the peak emission intensity of the broad peak 46 relative to the intensity of the main narrowband red (KSF) emission peak is at least about 25%; for a color temperature of about 3000K the peak emission intensity of the broad emission peak relative to the intensity of the main narrowband red (KSF) emission peak is at least about 30%; for a color temperature of about 4000K the peak emission intensity of the broad emission peak relative to the intensity of the main narrowband red (KSF) emission peak is at least about 35%; for a color temperature of about 5000K the peak emission intensity of the broad emission peak relative to the intensity of the main narrowband red (KSF) emission peak is at least about 40%; and for a color temperature of about 6500K the peak emission intensity of the broad emission peak relative to the intensity of the main narrowband red (KSF) emission peak is at least about 50%.

The peak emission wavelength of the broad emission peak depends on the peak emission wavelengths of the yellow to green and broadband orange to red photoluminescence materials as well as the amount of broadband orange to red photoluminescence material relative to the amount of yellow to green photoluminescence material. For example, for lower color temperatures, e.g. warm white, the device comprises a greater amount of broadband orange to red photoluminescence material and the peak emission wavelength of the broad emission peak occurs at longer wavelengths closer to peak emission wavelength of the broadband orange to red photoluminescence material. Conversely, at higher color temperatures, e.g. cool white, where the device comprises a lesser amount of broadband orange to red photoluminescence material, the peak emission wavelength of the broad emission peak will occur at a shorter wavelength closer to the peak emission wavelength of the yellow to green photoluminescence material. The peak emission intensity of the broad emission peak relative to the intensity of the main narrowband red (KSF) emission peak depends primarily on the amount of broadband orange to red photoluminescence material. For example, for lower color temperatures, e.g. warm white, where the device comprises a greater amount of broadband orange to red photoluminescence material the peak emission intensity of the broad emission peak will be lower and at higher color temperatures, e.g. cool white, where the device comprises a lesser amount of broadband orange to red photoluminescence material, the peak emission intensity of the broad emission peak will greater.

As can be derived from TABLE 25, for a device with a CCT from 2200K to 3000K (corresponding to about 3.0 to about 8.0 wt % CASN) the device has an LE of at least 330 lm/W$_{opt}$ to 358 lm/W$_{opt}$ and $\lambda_{pe}$ of the broad emission peak 46 is about 580 to 600 nm. For a device with a CCT of about 4000K (corresponding to about 3.8 wt % CASN) the device has an LE of about 330 lm/W$_{opt}$ to 345 lm/W$_{opt}$ and $\lambda_{pe}$ of the broad emission peak 46 is about 570 nm to 580 nm. For a device with a CCT of about 5000K (corresponding to about 2.5 wt % CASN) the device has an LE of about 330 lm/W$_{opt}$ and $\lambda_{pe}$ of the broad emission peak 46 is about 550 nm to 570 nm.

The foregoing are tabulated in TABLE 26.

TABLE 26

| | | Broad emission peak 46 | | |
|---|---|---|---|---|
| CCT (K) | LE (lm/W$_{opt}$) | $\lambda_{pe}$ (nm) | Intensity at $\lambda_{pe}$ relative to intensity of KSF main peak | wt % CASN of total red phosphor |
| 2200 | 330 to 345 | 590 to 600 | at least 25% | 8.0 |
| 2700 | 340 to 350 | 590 to 600 | at least 25% | 3.5 |
| 3000 | 343 to 358 | 580 to 590 | at least 30% | 3.4 |
| 4000 | 330 to 345 | 570 to 580 | at least 35% | 3.8 |

TABLE 26-continued

| | | Broad emission peak 46 | | |
|---|---|---|---|---|
| CCT (K) | LE (lm/W$_{opt}$) | $\lambda_{pe}$ (nm) | Intensity at $\lambda_{pe}$ relative to intensity of KSF main peak | wt % CASN of total red phosphor |
| 5000 | 325 to 330 | 550 to 570 | at least 40% | 2.4 |
| 6500 | 310 to 325 | 530 to 550 | at least 50% | 1.1 |

In summary, it will be appreciated that devices in accordance with the invention can be configured to produce white light with a color temperature between about 2700K to 6500K that meet current standards for CRI Ra, CRI R8 and CRI R9 and have a conversion efficiency (CE) and luminous efficacy (LE) (330 lm/W to 350+ lm/W depending on color temperature) that are superior than those of known devices. More particularly, devices having between about 1.0 wt % and about 12 wt %, more particularly between about 1.0 wt % and about 5 wt %, broadband orange to red photoluminescence material (e.g. CASN) out of the total red photoluminescence material content (broadband orange to red photoluminescence material+narrowband red photoluminescence material e.g. CASN+KSF) can produce white light that meet the current standards of CRI Ra of about 90, a CRI R8 of about 72 and a CRI R9 of about 50 and have a conversion efficiency/luminous that are superior known devices. Moreover, the invention provides a white emitting device that has an optimal luminous efficacy (350+lm/W) while meeting current standards for CRI Ra, CRI R8 and CRI R9 by the inclusion of about 3.0 wt % broadband orange to red photoluminescence material (e.g. CASN) out of the total red photoluminescence material content.

Although the present invention has been particularly described with reference to certain embodiments thereof, it should be readily apparent to those of ordinary skill in the art that changes and modifications in the form and details may be made without departing from the spirit and scope of the invention.

As used in this document, both in the description and in the claims, and as customarily used in the art, the words "substantially," "approximately," and similar terms of approximation are used to account for manufacturing tolerances, manufacturing variations, and manufacturing imprecisions that are inescapable parts of fabricating any mechanism, structure, or composition in the physical world.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Further, the figures are merely exemplary and not limiting. Topical headings and subheadings are for the convenience of the reader only. They should not and cannot be construed to have any substantive significance, meaning or interpretation, and should not and cannot be deemed to indicate that all of the information relating to any particular topic is to be found under or limited to any particular heading or subheading. The purpose of the abstract of this document is to enable the U.S. Patent and Trademark Office, as well as readers who are not familiar with patent or legal terms or phraseology, to determine quickly from a cursory inspection the nature of the technical disclosure of the application. The abstract is not intended to define the invention, nor is it intended to limit to the scope of the invention. Therefore, the invention is not to be restricted or limited except in accordance with the following claims and their legal equivalents.

What is claimed is:

1. A light emitting device comprising:
   a solid-state light emitter with a wavelength from 440 nm to 470 nm;
   a cerium-activated garnet phosphor;
   a broadband europium-activated nitride orange to red phosphor of general composition CaAlSiN$_3$:Eu; and
   a narrowband manganese-activated fluoride red phosphor selected from the group consisting of: K$_2$SiF$_6$:Mn$^{4+}$, K$_2$GeF$_6$:Mn$^{4+}$, and K$_2$TiF$_6$:Mn$^{4+}$;
   wherein in response to a voltage, the device generates light comprising a first maximum intensity at a wavelength in a range from 530 nm to 600 nm and a second maximum intensity at a wavelength in a range from 625 nm to 635 nm, wherein a ratio of the first maximum intensity to the second maximum intensity is about 20% to about 50%; and
   wherein said light comprises a color temperature in a range from about 2200K to about 6500K, a CRI Ra of at least 90, and the device has a luminous efficacy of at least 330 lm/W$_{opt}$.

2. The light emitting device of claim 1, wherein the ratio of the first maximum intensity to the second maximum intensity is about 20% to about 30%.

3. The light emitting device of claim 2, wherein the device generates light with a color temperature from about 2200K to about 3000K.

4. The light emitting device of claim 3, wherein the first maximum intensity comprises a broad emission peak in a range from about 580 nm to about 600 nm.

5. The light emitting device of claim 1, wherein the ratio of the first maximum intensity to the second maximum intensity is about 30% to about 35%.

6. The light emitting device of claim 5, wherein the device generates light with a color temperature from about 3000K to about 4000K.

7. The light emitting device of claim 6, wherein the first maximum intensity comprises a broad emission peak in a range from about 570 nm to about 580 nm.

8. The light emitting device of claim 1, wherein the ratio of the first maximum intensity to the second maximum intensity is about 35% to about 40%.

9. The light emitting device of claim 8, wherein the device generates light with a color temperature from about 4000K to about 5000K.

10. The light emitting device of claim 9, wherein the first maximum intensity comprises a broad emission peak in a range from about 550 nm to about 570 nm.

11. The light emitting device of claim 1, wherein the ratio of the first maximum intensity to the second maximum intensity is about 40% to about 50%.

12. The light emitting device of claim 11, wherein the device generates light with a color temperature from about 5000K to about 6500K.

13. The light emitting device of claim 12, wherein the first maximum intensity comprises a broad emission peak in a range from about 530 nm to about 550 nm.

14. The light emitting device of claim 1, wherein the broadband europium-activated nitride orange to red phosphor has a peak emission wavelength from about 600 nm to about 620 nm.

15. The light emitting device of claim 1, wherein the cerium-activated garnet phosphor is selected from the group consisting of: a phosphor of general composition (Y,Lu)$_3$ (Al,Ga)$_5$O$_{12}$:Ce; a phosphor of general composition Y$_3$(Al,Ga)$_5$O$_{12}$:Ce; and a phosphor of general composition Lu$_3$Al$_5$O$_{12}$:Ce.

16. The light emitting device of claim 1, wherein the device generates light with at least one of: a CRI R9 of at least 50 and a CRI R8 of at least 72.

17. A light emitting device comprising:
a solid-state light emitter with a wavelength from 440 nm to 470 nm;
a cerium-activated garnet phosphor;
a broadband europium-activated nitride orange to red phosphor of general composition CaAlSiN$_3$:Eu; and
a narrowband manganese-activated fluoride red phosphor selected from the group consisting of: K$_2$SiF$_6$:Mn$^{4+}$, K$_2$GeF$_6$:Mn$^{4+}$, and K$_2$TiF$_6$:Mn$^{4+}$;
wherein:
in response to a voltage, the device generates light comprising a color temperature in a range from about 2200K to about 6500K, a general CRI Ra of at least 90, and a spectrum having a maximum intensity in a range from 530 nm to 600 nm; wherein the maximum intensity is in a range from about 580 nm to 600 nm when the color temperature is in a range from about 2200K to about 3000K;
the maximum intensity is in a range from about 570 nm to 580 nm when the color temperature is in a range from about 3000K to 4000K;
the maximum intensity is in a range from about 550 nm to 570 nm when the color temperature is in a range from about 4000K to 5000K;
the maximum intensity is in a range from about 530 nm to 550 nm when the color temperature is a range from about 5000K to 6500K; and
wherein the device has a luminous efficacy of at least 330 lm/W$_{opt}$.

18. The light emitting device of claim 17, wherein the broadband europium-activated nitride orange to red phosphor has a peak emission wavelength from about 600 nm to about 620 nm.

19. The light emitting device of claim 17, wherein the device generates light with at least one of: a CRI R8 of at least 72 and a CRI R9 of at least 50.

20. A light emitting device comprising:
a solid-state light emitter with a wavelength from 440 nm to 470 nm;
a cerium-activated garnet phosphor;
a broadband europium-activated nitride orange to red phosphor of general composition CaAlSiN$_3$:Eu; and
a narrowband manganese-activated fluoride red phosphor selected from the group consisting of: K$_2$SiF$_6$:Mn$^{4+}$, K$_2$GeF$_6$:Mn$^{4+}$, and K$_2$TiF$_6$:Mn$^{4+}$;
wherein in response to a voltage, the device generates light comprising a Correlated Color Temperature in a range from about 2200K to about 6500K, a luminance, a general CRI Ra of at least 90, and a spectrum, which over a wavelength range from about 500 nm to about 600 nm, a maximum deviation between the intensity of light emitted by the device compared with the intensity of light of the spectrum of a black-body or standard illuminant having the same Correlated Color Temperature and luminance is less than 0.3; and the device has a luminous efficacy of at least 330 lm/W$_{opt}$.

21. The light emitting device of claim 20, wherein said maximum deviation is less than 0.2.

22. The light emitting device of claim 20, wherein said maximum deviation is less than 0.1.

23. The light emitting device of claim 20, wherein the device generates light with at least one of: a CRI R8 of at least 72 and a CRI R9 of at least 50.

* * * * *